(12) United States Patent
Takata et al.

(10) Patent No.: US 11,047,889 B2
(45) Date of Patent: Jun. 29, 2021

(54) MONITORING APPARATUS, MONITORING METHOD, AND NON-TRANSITORY RECORDING MEDIUM

(71) Applicant: Hitachi, Ltd., Tokyo (JP)

(72) Inventors: Mika Takata, Tokyo (JP); Norifumi Nishikawa, Tokyo (JP)

(73) Assignee: HITACHI, LTD., Tokyo (JP)

( * ) Notice: Subject to any disclaimer, the term of this patent is extended or adjusted under 35 U.S.C. 154(b) by 682 days.

(21) Appl. No.: 15/560,279

(22) PCT Filed: Aug. 7, 2015

(86) PCT No.: PCT/JP2015/072485
§ 371 (c)(1),
(2) Date: Sep. 21, 2017

(87) PCT Pub. No.: WO2017/026002
PCT Pub. Date: Feb. 16, 2017

(65) Prior Publication Data
US 2018/0074099 A1    Mar. 15, 2018

(51) Int. Cl.
*G01R 21/133* (2006.01)
*G06F 16/903* (2019.01)
(Continued)

(52) U.S. Cl.
CPC ....... *G01R 21/133* (2013.01); *G05B 23/0235* (2013.01); *G06F 16/90335* (2019.01);
(Continued)

(58) Field of Classification Search
CPC ............ G01R 21/133; G06F 16/90335; G05B 23/0235
See application file for complete search history.

(56) References Cited

U.S. PATENT DOCUMENTS

2008/0034258 A1* 2/2008 Moriya .............. G05B 19/4184
714/57
2010/0333022 A1* 12/2010 Inoue ............... H04N 21/44222
715/811
(Continued)

FOREIGN PATENT DOCUMENTS

JP      2003-132088 A    5/2003
JP      2012-011798 A    1/2012

OTHER PUBLICATIONS

Takata et al., "Proposal of analytics software architecture with data preparation layer for fast event identification in wide-area situational awareness", 2015 IEEE International Conference on Industrial Technology (ICIT); pp. 1741-1746.
(Continued)

*Primary Examiner* — Lisa E Peters
(74) *Attorney, Agent, or Firm* — Mattingly & Malur, PC

(57) ABSTRACT

A monitoring apparatus is coupled to a sensor configured to observe a behavior of a monitoring target, and is accessible a storage device being configured to store: a database stored a phenomenon data group; stability information; and operation history information. The monitoring apparatus is configured to: calculate a stability of input phenomenon data; determine whether the stability of the input phenomenon data is a stability indicating a specific behavior; retrieve from the database, when the stability of the input phenomenon data is a stability, similar phenomenon data that is similar to the input phenomenon data; generate, by acquiring from the stability information a stability of subsequent phenomenon data continuous with the similar phenomenon data, similar case data combining the similar phenomenon data and the subsequent phenomenon data; identify, from the operation history information, operation content; and output the similar case data and the operation content.

12 Claims, 19 Drawing Sheets

(51) Int. Cl.
*G05B 23/02* (2006.01)
*H04Q 9/00* (2006.01)
*H02J 13/00* (2006.01)

(52) U.S. Cl.
CPC .......... *H02J 13/0006* (2013.01); *H04Q 9/00* (2013.01); *H04Q 2209/823* (2013.01)

(56) References Cited

U.S. PATENT DOCUMENTS

2015/0363249 A1* 12/2015 Mizobuchi .............. H04L 41/00 714/47.3
2017/0278200 A1* 9/2017 Yamazaki ........... H02J 13/0079

OTHER PUBLICATIONS

International Search Report of PCT/JP2015/072485 dated Oct. 20, 2015.

\* cited by examiner

| SENSOR ID | START TIME | END TIME | IMPORTANCE LEVEL | OPERATION CONTENT | OPERATION TIME |
|---|---|---|---|---|---|
| 501 | 502 | 503 | 504 | 505 | 506 |
| 001 | 2015/07/05 00:00:00 | 2015/07/05 00:02:00 | 9 | GENERATOR OUTPUT SUPPRESSION | 2015/07/05 00:01:00 |
| 001 | 2015/07/05 00:02:00 | 2015/07/05 00:04:00 | 8 | SUPPRESSION OF AUTOMATIC VOLTAGE REGULATION | 2015/07/05 00:03:00 |
| 001 | 2015/07/05 00:04:00 | 2015/07/05 00:06:00 | 10 | GENERATOR OUTPUT INCREASE | 2015/07/05 00:05:00 |
| 002 | 2015/07/05 00:00:00 | 2015/07/05 00:02:00 | 8 | AUTOMATIC VOLTAGE REGULATION | 2015/07/05 00:01:00 |
| ... | ... | ... | ... | ... | ... |

MONITORING APPARATUS, MONITORING METHOD, AND NON-TRANSITORY RECORDING MEDIUM

BACKGROUND

This invention relates to a monitoring apparatus, a monitoring method, and a monitoring program, for monitoring a monitoring target.

In recent years, the worsening of large-scale power failures in various foreign countries has been accelerating the introduction of phasor measurement units (PMUs). PMUs are configured to measure data, for example, current, voltage, and frequency, hundreds of times more frequently than in traditional supervisory control and data acquisition (SCADA). As a result, for example, when 500 pieces of PMU data are continuously accumulated, in one year, the amount of accumulated data is from several ten terabytes to several hundred terabytes. Analysis of the patterns that such a large amount of data has enables an ordinary power system to operate in a stable manner. A waveform pattern in time-series data exhibits a phenomenon in which a measurement value, for example, frequency or active power, increases or decreases. As a result, when the power system becomes unstable during real-time operation, it is necessary for the operator to confirm whether or not similar instability (i.e., an unstable phenomenon) has occurred in the past, and to know what operations are to be performed in the current situation. A system configured to perform similarity retrieval by using the waveform or a feature amount of time-series data has already been disclosed (JP 2003-132088A, Proposal of analytics software architecture with data preparation layer for fast event identification in wide-area situational awareness; Takata, Mika; Miyata, Yasushi; Nishikawa, Norifumi; 2015 IEEE International Conference on Industrial Technology (ICIT); Pages 1741-1746).

In a system like that described above, in which data having a high similarity is retrieved from a phenomenon, a case that resulted in an accident is preferentially displayed. However, it is unclear whether the case that resulted in an accident subsequently recovered at an early stage, and how long recovery took. Even on the assumption that the system recovered, it is also unclear when and what the operator did to cause the system to recover. Therefore, just preferentially displaying a case that resulted in an accident does not necessarily lead to saving decision making time. In order to acquire the data necessary for the operator to operate the power system, the time required for data acquisition and a sensor ID of the sensor detecting the data need to be specified. As a result, the data that is valuable in operating the power system is not known just based on similarity retrieval, and the operator performs trial-and-error in order to learn what he or she should do in the current situation.

SUMMARY

It is an object of this invention to easily identify the details regarding how and why a monitoring target becomes stable or unstable based on past similar cases.

An aspect of the invention disclosed in this application is a monitoring apparatus, which is coupled to a sensor configured to observe a behavior of a monitoring target, and is capable of accessing a storage device, the storage device being configured to store: a database configured to store a phenomenon data group, which is a collection of phenomenon data representing a time-series observation value for each predetermined time width observed by the sensor; stability information for storing, for each piece of phenomenon data in the phenomenon data group, a stability indicating how stably the monitoring target is operating; and operation history information for storing identification information on the sensor, a given time band, and content of an operation performed on the monitoring target in the given time band, the monitoring apparatus being configured to execute: calculation processing for calculating a stability of input phenomenon data representing a time-series observation value observed by the sensor during a retrieval target period; determination processing for determining whether or not the stability of the input phenomenon data calculated by the calculation processing is a stability indicating a specific behavior by the monitoring target; retrieval processing for retrieving from the database, when it is determined by the determination processing that the stability of the input phenomenon data is a stability indicating the specific behavior, similar phenomenon data that is similar to the input phenomenon data; generation processing for generating, by acquiring from the stability information a stability of subsequent phenomenon data continuous with the similar phenomenon data after a period of the similar phenomenon data retrieved by the retrieval processing until the stability becomes a stability no longer indicating the specific behavior by the monitoring target, similar case data combining the similar phenomenon data and the subsequent phenomenon data for which the stability has been acquired; identification processing for identifying, from the operation history information, operation content corresponding to the period of the similar case data generated by the generation processing; and output processing for outputting the similar case data and the operation content identified by the identification processing in association with each other.

According to the representative embodiment of this invention, the details regarding how and why a monitoring target becomes stable or unstable can easily be identified based on past similar cases. Other features, aspects, and advantages of the subject matter will become apparent from the description, the drawings, and the claims.

BRIEF DESCRIPTION OF THE DRAWINGS

FIG. 5 is a table for showing a storage content example of the operation history table.

DETAILED DESCRIPTION OF THE EMBODIMENT

In the following description, although pieces of information of this invention are described by using such expressions as "aaa table", "aaa list", "aaa DB", and "aaa queue", those pieces of information may be expressed by data structures other than a table, a list, a DB, a queue, and the like. Therefore, "aaa table", "aaa list", "aaa DB", "aaa queue", and the like are sometimes referred to as "aaa information" in order to show that those pieces of information are independent of their data structures.

In addition, although such expressions as "identification information", "identifier", "name", "ID" are used in order to describe details of each piece of information, those expressions are interchangeable.

In the following description, although a description is given by using "program" as a subject in some cases, the program is executed by a processor to perform defined processing while using a memory and a communication port (communication control device). Therefore, the description given by using "program" as a subject may also be interpreted as a description given by using "processor" as a subject. Further, various programs may also be installed onto each computer by a program distribution server or computer-readable memory media. In the following description, a user of the system may be referred to as an "operator" or an "operating person", but those terms have the same meaning herein.

First Embodiment

<Stable Case Output Example>

Figure 1:
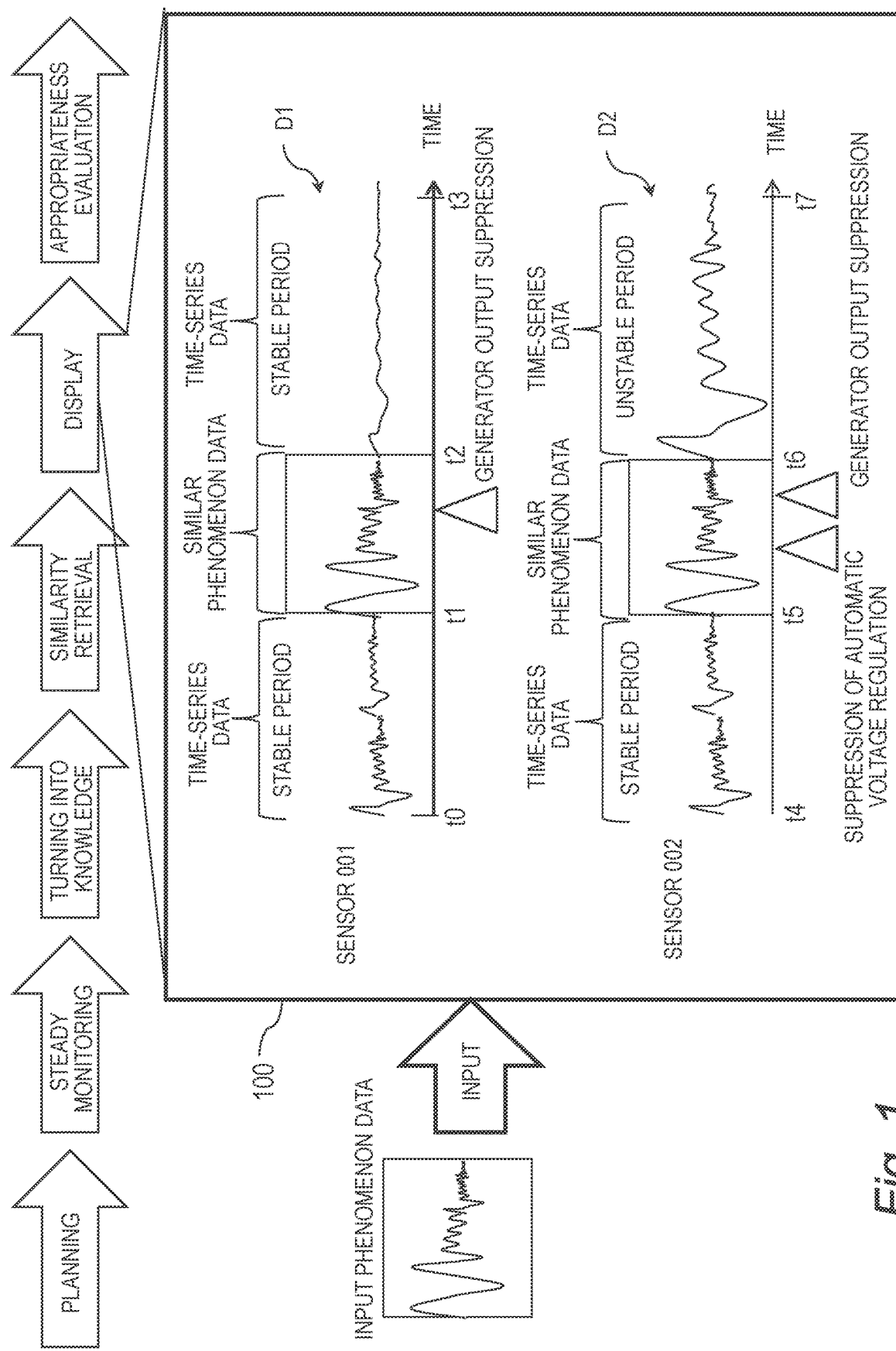
FIG. 1 is an explanatory diagram for illustrating a stable case output example.

FIG. 1 is an explanatory diagram for illustrating a stable case output example. In FIG. 1, the upper level group of arrows in bold represent an example of a work flow. In the work flow, the operator performs, in order, "planning", "steady monitoring", "turning into knowledge", "similarity retrieval", "display", and "appropriateness evaluation". A monitoring apparatus is configured to monitor a monitoring target in accordance with the "planning". The monitoring apparatus is coupled to a PMU or other such sensor. The sensor is configured to measure time-series data representing temporal changes in current, voltage, and frequency from the monitoring target. During "steady monitoring", the monitoring apparatus inputs the time-series data from the sensor. The input time-series data is referred to as "input phenomenon data". During "turning into knowledge", the monitoring apparatus accumulates the input phenomenon data. During "similarity retrieval", when there has been an instruction from the operator, the monitoring apparatus retrieves time-series data that is similar to the input phenomenon data (hereinafter referred to as "similar phenomenon data").

During "display", the monitoring apparatus displays display data 100 to be viewed by the operator. The display data 100 includes case data D1 and D2. The case data D1 and D2 are time-series data that combine the similar phenomenon data and the time-series data before and after that similar phenomenon data. In the graph, the axis of abscissa represents time, and the axis of ordinate represents an observation value, for example, the current, the voltage, or the frequency. The case data D1 indicates that the monitoring target is stable from a section [t0, t1] before a section [t1, t2] of the similar phenomenon data until the next section [t2, t3] of the section [t1, t2] of the similar phenomenon data. The monitoring apparatus displays the fact that, during the section [t1, t2], the operator performed an operation of "generator output suppression". As a result, an operator who has seen the display content understands that when the operation "generator output suppression" has been performed during the section [t1, t2] of the similar phenomenon data, the observation value in the next section [t2, t3] of the section [t1, t2] is in a stable state.

The case data D2 indicates that the monitoring target is stable from a section [t4, t5] before a section [t5, t6] of the similar phenomenon data until the section [t5, t6] in which the similar phenomenon data is detected, but then becomes unstable in the next section [t6, t7]. The monitoring apparatus displays the fact that, during the section [t5, t6], the operator performed "suppression of automatic voltage regulation" and "generator output suppression" in order. As a result, an operator who has seen the display content understands that when "suppression of automatic voltage regulation" and "generator output suppression" are performed in order during the section [t5, t6] of the similar phenomenon data, the observation value in the next section [t6, t7] of the section [t5, t6] is in an unstable state.

In other words, for example, when there has been an accident in the monitoring target after a section of the input phenomenon data has elapsed, simply by providing the input phenomenon data to the monitoring apparatus, the operator can grasp what type of operation, which was performed during the relevant section, has led to the result of the monitoring target becoming stable or unstable. Therefore, trial-and-error in decision making in system operation by the operator is decreased, and the speed of decision making is decreased. In the following description, the section may be referred to as "window", and the width of the section may be referred to as "window width".

<Hardware Configuration Example of Monitoring Apparatus>

Figure 2:
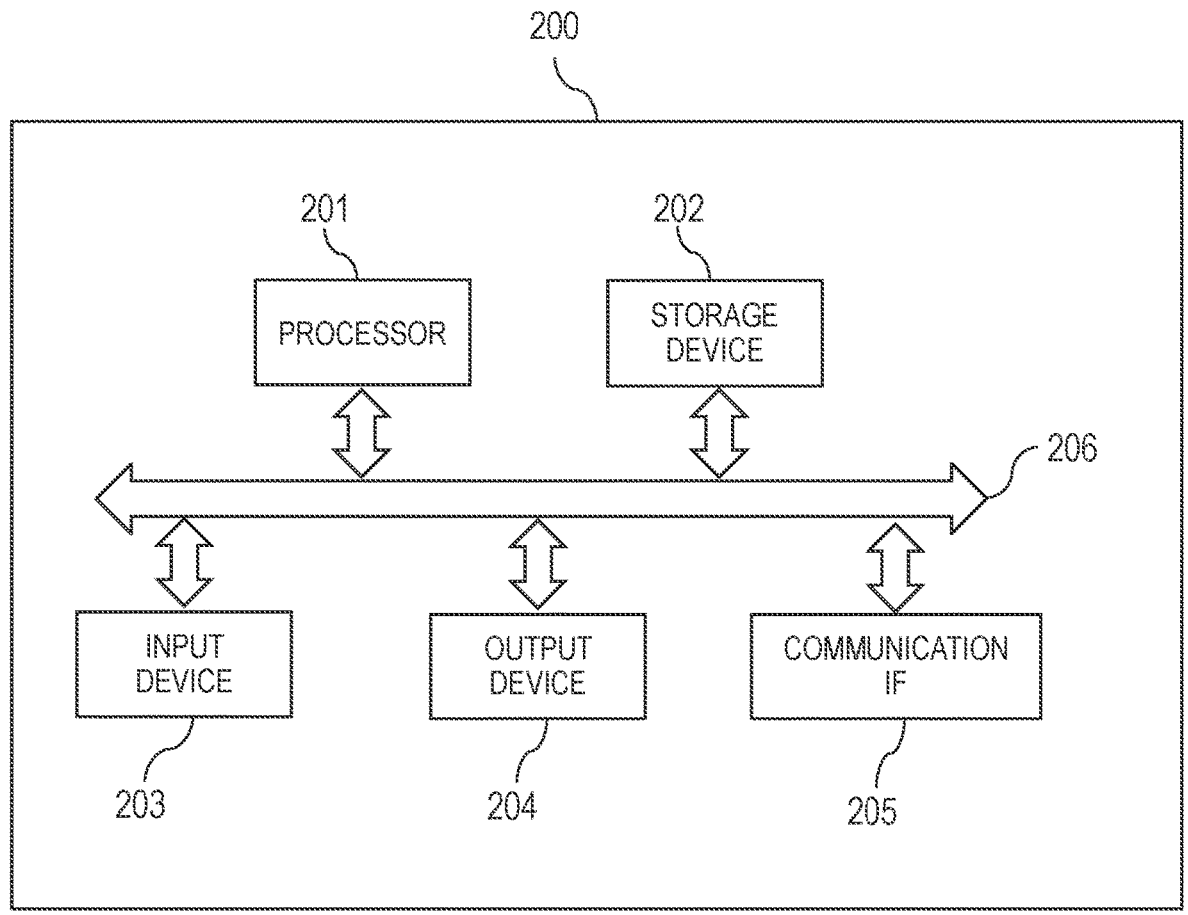
FIG. 2 is a block diagram illustrating a hardware configuration example of the monitoring apparatus.

FIG. 2 is a block diagram illustrating a hardware configuration example of the monitoring apparatus 200. The monitoring apparatus 200 includes a processor 201, a storage device 202, an input device 203, an output device 204, and a communication interface (communication IF) 205. The processor 201, the storage device 202, the input device 203, the output device 204, and the communication IF 205 are connected to one another by a bus 206. The processor 201 controls the monitoring apparatus 200. The storage device 202 serves as a work area of the processor 201. The storage device 202 is a recording medium which stores various programs and data. The storage device 202 can be, for example, a read-only memory (ROM), a random access memory (RAM), a hard disk drive (HDD), or a flash memory. The input device 203 inputs data. The input device 203 can be, for example, a keyboard, a mouse, a touch panel, a ten-key pad, or a scanner. The output device 204 outputs data. The output device 204 can be, for example, a display or a printer. The communication IF 205 couples to a network to transmit and receive data. The monitoring apparatus 200 may be constructed from a plurality of apparatus. In this case, the plurality of monitoring apparatus 200 are coupled to each other via a network.

<Functional Configuration Example of Monitoring Apparatus 200>

Figure 3:
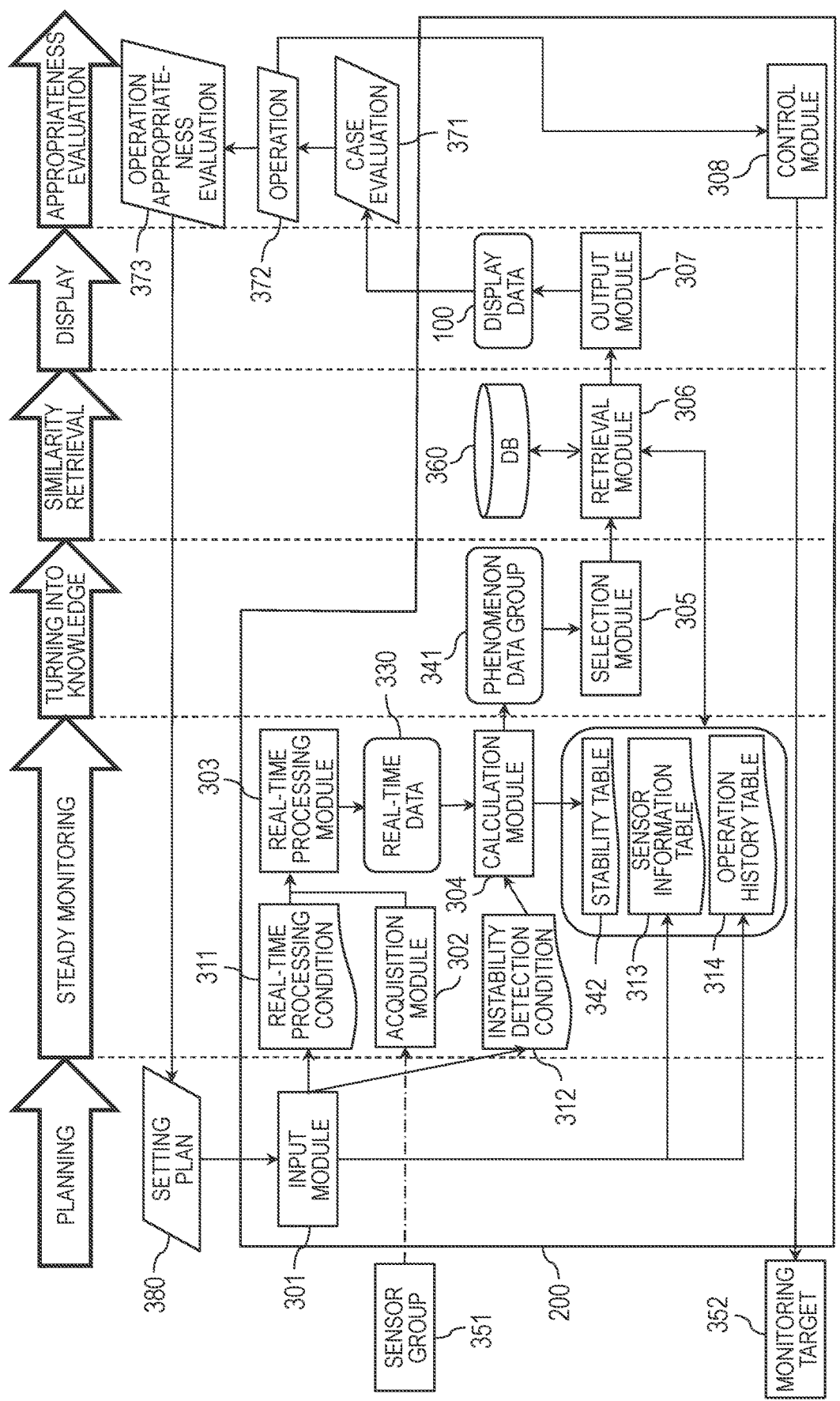
FIG. 3 is a block diagram for illustrating a functional configuration example of the monitoring apparatus according to a first embodiment of this invention.

FIG. 3 is a block diagram for illustrating a functional configuration example of the monitoring apparatus 200 according to a first embodiment of this invention. The monitoring apparatus 200 is coupled to, of a sensor group 351 and a monitoring target 352, at least the sensor group 351. The monitoring apparatus 200 is configured to monitor the monitoring target 352 by using the sensor group 351. The monitoring target 352 may be any target that is observable by a sensor. For example, the monitoring target 352 is an electric power system, a cloud server group, or a farm. The sensor group 351 is a collection of one or more sensors. For example, when the monitoring target 352 is an electric power system, the sensor is a PMU.

The monitoring apparatus 200 includes an input module 301, an acquisition module 302, a real-time processing module 303, a calculation module 304, a selection module 305, a retrieval module 306, an output module 307, and a control module 308. The function of each of the input module 301 to the control module 308 is implemented by, specifically, for example, the relevant module causing the processor 201 to execute a program stored in the storage device 202 illustrated in FIG. 2. The monitoring apparatus 200 also includes a stability table 342, a sensor information table 313, and an operation history table 314. The stability table 342 to the operation history table 314 are, specifically, for example, information stored in the storage device 202 illustrated in FIG. 2. The parallelogram-shaped blocks in FIG. 3 represent operations, thoughts, or actions by the operator.

The input module 301 is configured to receive information based on an operation on the input device 203 by the operator or based on the reception from outside, and to input the received information to the monitoring apparatus 200.

Examples of input information include a real-time processing condition 311, an instability detection condition 312, the sensor information table 313, and the operation history table 314.

The real-time processing condition 311 is information for defining a window width and a step width to be used by the real-time processing module 303. The instability detection condition 312 is a condition for defining a stability calculation scheme and an instability determination scheme.

The sensor information table 313, which is a table for managing information from the sensor group 351, stores an affiliated group of each sensor and a sensor installation position. The sensor information table 313 is described in detail later with reference to FIG. 4.

The operation history table 314 is a table for storing history information on the monitoring target 352 operated by the operator. The operation history table 314 is described in detail later with reference to FIG. 5.

The acquisition module 302 is configured to acquire data detected by each of the sensors of the sensor group 351.

The real-time processing module 303 is configured to execute real-time processing on a series of data sequentially input from the acquisition module 302. The real-time processing is processing for transmitting, while shifting a window having a predetermined time width (i.e., window width) by a step width amount, the data in each window to the calculation module 304. The step width is a time width equal to or less than the window width. The data in the windows is the input phenomenon data illustrated in FIG. 1.

The real-time processing module 303 is configured to store in a DB 360 the input phenomenon data as real-time data. The DB 360 is, specifically, for example, information stored in the storage device 202 illustrated in FIG. 2. The details of the processing procedure by the real-time processing module 303 are described later with reference to FIG. 8.

The calculation module 304 is configured to associate, and store in the stability table 342, the stability and time-series information identified by the window including the input phenomenon data, which is the calculation source. The time-series information is information for identifying a time-series order of the windows. Examples of the time-series information include a combination of a start time (i.e., oldest time) and an end time (i.e., newest time) of the input phenomenon data in the windows, the start time, the end time, a median time, a time of a specific order, and a randomly selected time. The time-series information is not limited to time, and only needs to be information for identifying a time-series order of each window in a relative manner with respect to another window. The stability table 342 is described later.

The stability is an index value representing how stably the monitoring target 352, which is the detection source of the input phenomenon data, is operating. The instability detection condition 312 is, as described above, a condition for defining the stability calculation scheme and the instability determination scheme. The stability calculation scheme is a condition for defining the calculation source and the calculation method of the stability. The result of calculation by the calculation method is a stability.

Examples of the stability calculation scheme include "stability is set to spectrum intensity obtained by converting input phenomenon data into spectrum" and "stability is set to average value of input phenomenon data". In the case of "stability is set to spectrum intensity obtained by converting input phenomenon data into spectrum", the "input phenomenon data" is the calculation source, "spectrum conversion" is the calculation method, and the "spectrum intensity" is the calculation result, i.e., the stability. In the case of "stability is set to average value of input phenomenon data", the "input phenomenon data" is the calculation source, "averaging processing" is the calculation method, and the "average value" is the calculation result, i.e., the stability.

The instability determination scheme is a determination criterion regarding whether or not the stability indicates instability and a determination method using that determination criterion. An example of the instability determination scheme is "consider instability to have occurred when stability is equal to or less than predetermined threshold". In this case, the "predetermined threshold" is the determination criterion, and "consider instability to have occurred when stability is equal to or less than predetermined threshold" is the determination method. In other words, "instability" refers to cases in which the stability is equal to or less than a predetermined threshold (or may be less than the predetermined threshold).

The calculation module 304 may be configured to output the calculated stability and the determination result from the instability determination scheme to a real-time monitor. The calculation module 304 may be configured to constantly output the stability and the determination result from the instability determination scheme, or to output the stability and the determination result from the instability determination scheme as an alert when instability is determined to have occurred. The real-time monitor may be configured to display the alert on a screen of the real-time monitor, or to output the alert as a sound or by mail transmission to an external apparatus, for example.

The calculation module 304 is configured to determine whether or not the calculated stability indicates instability. Specifically, for example, when the stability is equal to or less than a threshold representing instability, the calculation module 304 determines that the input phenomenon data, which is the calculation source of the stability, is phenomenon data indicating instability. In this case, the calculation module 304 adds instability information to the input phenomenon data.

The calculation module 304 is also configured to determine whether or not the calculated stability indicates high stability. Specifically, for example, when the stability is equal to or more than a threshold representing high stability, the calculation module 304 determines that the input phenomenon data, which is the calculation source of the stability, is phenomenon data indicating high stability. In this case, the calculation module 304 adds high-stability information to the input phenomenon data. The details of the processing procedure by the calculation module 304 are described later with reference to FIG. 9.

The selection module 305 is configured to select a part or all of a phenomenon data group processed by the calculation module 304, and to transfer the selected phenomenon data group to a retrieval processing module. Specifically, for example, the selection module 305 selects the phenomenon data to which instability information and/or high-stability information have(has) been added, and transfers the selected phenomenon data to the retrieval processing module. The selection module 305 may also select phenomenon data to which instability information and high-stability information have not been added, and transfer the selected phenomenon data to the retrieval processing module. The selection regarding which phenomenon data is to be output to the retrieval module 306 may be defined by the instability detection condition 312 in advance, and the selection module 305 may refer to the instability detection condition 312 to select the phenomenon data. The details of the processing procedure by the selection module 305 are described later with reference to FIG. 10.

The retrieval module 306 is configured to retrieve phenomenon data similar to the input phenomenon data from the selection module 305. The retrieved phenomenon data is the similar phenomenon data of FIG. 1. Specifically, for example, the retrieval module 306 calculates a correlation coefficient of the similar phenomenon data with the input phenomenon data, and when the correlation coefficient is higher than a threshold, determines that the input phenomenon data and the similar phenomenon data are similar. The retrieval module 306 may also perform similarity retrieval in which a wavelet transform is used as waveform similarity retrieval.

The retrieval module 306 is configured to execute case data generation processing on the similar phenomenon data. The case data generation processing is processing for adding a window before and after the window of the similar phenomenon data.

Specifically, for example, when the similar phenomenon data contains instability information, the case data generation processing is processing for adding, for each window before and after the window of the similar phenomenon data, windows before and after the window of the similar phenomenon data until the stability of the phenomenon data is equal to or more than a predetermined threshold. When a window of phenomenon data having a stability equal to or more than the predetermined threshold has not appeared for a certain time, the retrieval module 306 may halt the case data generation processing midway through the processing. As a result, the retrieval module 306 is capable of retrieving case data in which an instability state continues from before the appearance of the similar phenomenon data until even after the appearance of the similar phenomenon data. The predetermined threshold mentioned here is a stability that is at least not considered to correspond to instability information, and may be a stability corresponding to the above-mentioned high stability. In this example, a window is added before and after the window of the similar phenomenon data, but the case data generation processing may be performed by adding a window only after the window of the similar phenomenon data.

Meanwhile, when the similar phenomenon data contains instability information, the case data generation processing is processing for adding, for each window width before and after the window width of the similar phenomenon data, window widths before and after the window width of the similar phenomenon data until the stability of the phenomenon data is equal to or less than a predetermined threshold. When a window of phenomenon data having a stability equal to or less than the predetermined threshold has not appeared for a certain time, the retrieval module 306 may halt the case data generation processing midway through the processing. As a result, the retrieval module 306 is capable of retrieving case data in which a high-stability state continues from before the appearance of the similar phenomenon data until even after the appearance of the similar phenomenon data. The predetermined threshold mentioned here is a stability that is at least not considered to indicate the above-mentioned high stability, and may be a stability indicating the above-mentioned instability. In this example, a window width is added before and after the window width of the similar phenomenon data, but the case data generation processing may be performed by adding a window width only after the window width of the similar phenomenon data.

The retrieval module 306 is configured to execute importance level calculation processing. The importance level calculation processing is processing for calculating an importance level of the case data obtained by the case data generation processing. In the importance level calculation processing, the importance level is calculated by dividing an importance level upper limit by the number of windows in the case data. The retrieval module 306 executes the importance level calculation processing when the importance level is not set in the time band of the case data in the operation history table 314. The details of the processing procedure by the retrieval module 306 are described later with reference to FIG. 11.

The retrieval module 306 searches the operation history table 314 based on the sensor ID of the sensor that observed the case data and the period of the input phenomenon data (i.e., combination of the start time and the end time) to acquire operation content, which is a value of an operation content field 505, and an operation time, which is a value of an operation time field 506. The retrieval module 306 may also acquire, when there is a value in an importance level field 504, that value as the importance level.

The retrieval module 306 retrieves from the sensor information table 313 the sensor IDs of the sensors in the same sensor group as the sensor that observed the similar case data. The retrieval module 306 calculates a distance between the sensor that observed the similar case data and the sensors identified by the retrieved sensor IDs by using position information (i.e., latitude and longitude) on the sensors. The retrieval module 306 includes in a retrieval result the retrieved sensor IDs, a location group label of the sensors identified by the sensor IDs, and the calculated distances.

The output module 307 is configured to output the retrieval result obtained by the retrieval module 306. Examples of the output format include displaying on a display, transmitting to an external apparatus, printing by a printer, and storing in the storage device 202. In the case of displaying on a display, the output module 307 displays the display data 100 illustrated in FIG. 1 as the retrieval result on the display. Specifically, for example, the output module 307 associates and outputs the case data, the operation content, the operation time, and the importance level. For example, the output module 307 displays a character string representing the operation content at a position of the operation time on a time axis of the case data. An output example is described later with reference to FIG. 16.

The output module 307 is configured to output, when the sensor IDs, the location group labels, and the distances are included in the retrieval result, those pieces of data together with the corresponding case data. The control module 308 is configured to control the monitoring target 352 based on operation input from the operator. Specifically, for example, the control module 308 controls or reduces an increase in the power output of the monitoring target 352 when there has been a generator output suppression operation.

A case evaluation 371 is an action in which the operator evaluates the case data by referring to the display data 100. An operation 372 is an action in which the operator operates the monitoring target 352 in accordance with the case evaluation 371. An operation appropriateness evaluation 373 is an action in which the operator evaluates the appropriateness of the action of the operation 372. A setting plan 380 is an action in which the operator corrects the real-time processing condition 311 and the instability detection condition 312 in accordance with the operation appropriateness evaluation 373.

<Specific Examples of Tables>

Figure 4:
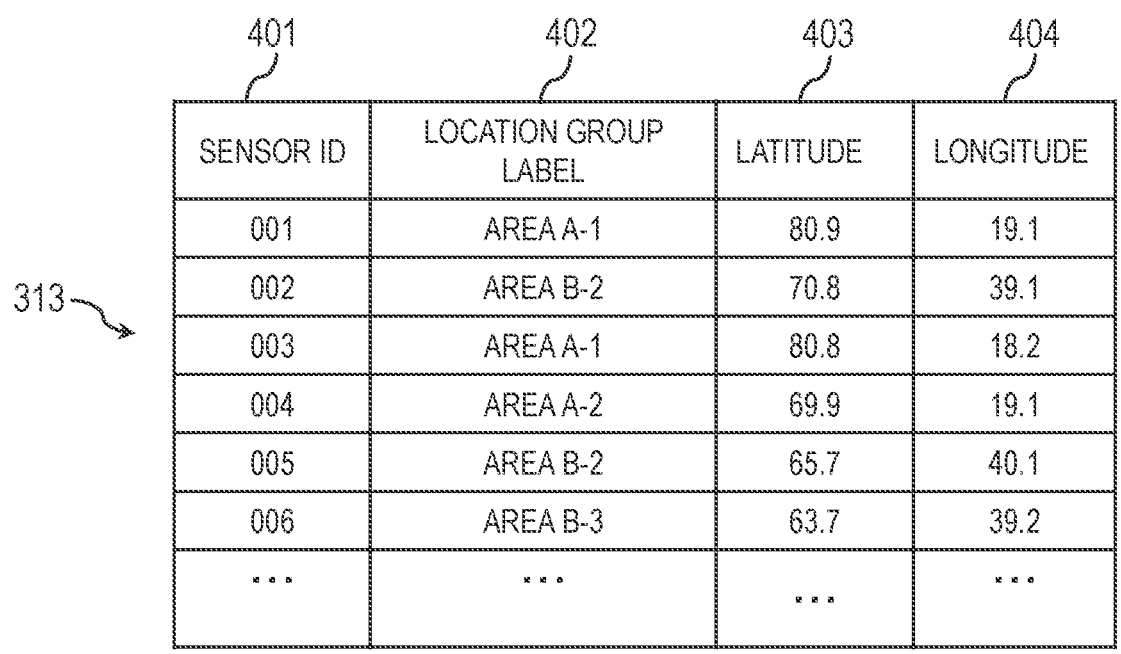
FIG. 4 is a table for showing a storage content example of the sensor information table.

FIG. 4 is a table for showing a storage content example of the sensor information table 313. The sensor information table 313 is a table that is set in advance. The sensor information table 313 includes a sensor ID field 401, a location group label field 402, a latitude field 403, and a longitude field 404. An entry for identifying the sensor information on each sensor is formed by combining the value in each of the fields 401 to 404.

The sensor ID field 401 is a storage area for storing the sensor ID. The sensor ID is identification information for uniquely identifying the sensor. The location group label field 402 is a storage area for storing a location group label. The location group label is an identification label for identifying the location group to which the sensor belongs. The location group is a group classified by regions. The latitude field 403 is an area for storing the latitude of an installation location of the sensor. The longitude field 404 is an area for storing the longitude of the installation location of the sensor.

The monitoring apparatus 200 is capable of identifying, by referring to the sensor information table 313, the location group to which each sensor belongs and the position at which each sensor is installed.

FIG. 5 is a table for showing a storage content example of the operation history table 314. The operation history table 314 is a table into which information is written by the operator. An example of the writing into the operation history table 314 is described later with reference to FIG. 7. The operation history table 314 includes a sensor ID field 501, a start time field 502, an end time field 503, an importance level field 504, an operation content field 505, and an operation time field 506. An entry for identifying the content of one operation is formed by combining the value in each of the fields 501 to 506.

The sensor ID field 501 is a storage area for storing the sensor ID. The start time field 502 is a storage area for storing the start time of the operation 372. The end time field 503 is a storage area for storing the end time of the operation 372. The importance level field 504 is a storage area for storing the importance level of the operation 372. The operation content field 505 is a storage area for storing the operation content of the operation 372 on the monitoring target. The operation time field 506 is a storage area for storing the time at which the operation 372 was performed on the monitoring target.

Figure 6:
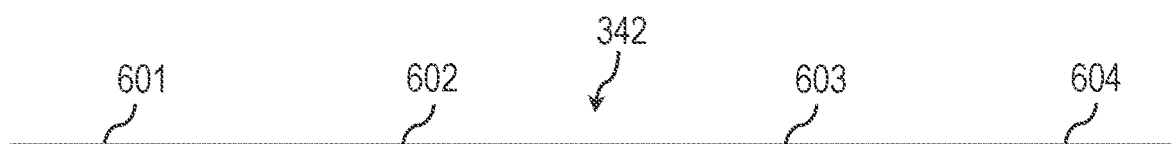
FIG. 6 is a table for showing a storage content example of the stability table.

FIG. 6 is a table for showing a storage content example of the stability table 342. The stability table 342 includes a sensor ID field 601, a start time field 602, an end time field 603, and a stability field 604. An entry for identifying the stability for each window is formed by combining the value in each of the fields 601 to 604.

The sensor ID field 601 is a storage area for storing the sensor ID. The start time field 602 is a storage area for storing the start time of the window including the input phenomenon data for which the stability is to be calculated. The end time field 603 is a storage area for storing the end time of the window including the input phenomenon data for which the stability is to be calculated. The stability field 604 is a storage area for storing the stability of the input phenomenon data. The entries in the stability table 342 are generated by the calculation module 304.

<Input Screen Example>

Figure 7:
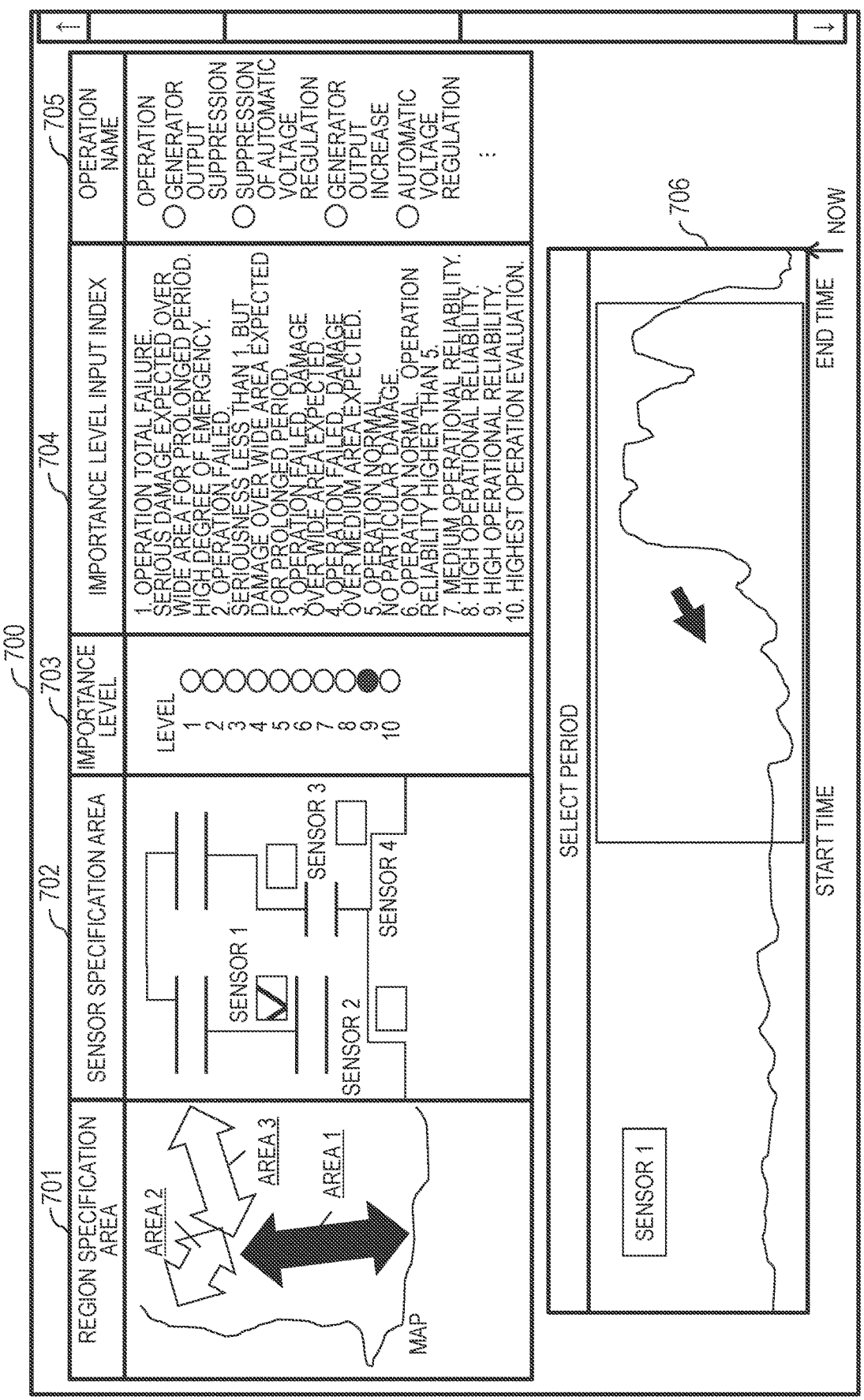
FIG. 7 is an explanatory diagram for illustrating an input screen example of the importance level in the first embodiment.

FIG. 7 is an explanatory diagram for illustrating an input screen example of the importance level in the first embodiment. An input screen 700 is a screen on which the importance level of the operation content of the operation 372 is input. The entries in the operation history table 314 shown in FIG. 5 are generated based on input to the input screen 700.

The input screen 700 includes a region specification area 701, a sensor specification area 702, an importance level specification area 703, an operation name specification area 705, and a phenomenon data display area 706. The region specification area 701 is an area for specifying the region(s) in which the sensor is installed. A map representing one or more regions is displayed on the region specification area 701. The operator specifies in the map the region for which the importance level is to be input.

The sensor specification area 702 is an area for specifying a sensor. One or more sensors installed in the region specified by the region specification area 701 are displayed in the sensor specification area 702. The operator specifies from among those sensors the sensor for which the importance level is to be input. The monitoring apparatus 200 stores the sensor ID of the specified sensor in the sensor ID field 501 of the operation history table 314. The monitoring apparatus 200 displays the phenomenon data of the specified sensor in the phenomenon data display area 706.

The importance level specification area 703 is an area for specifying the importance level. In FIG. 7, there is illustrated an example in which the importance level can be selected from among radio buttons numbered 1 to 10. The operator specifies the importance level for the phenomenon data detected by the specified sensor by referring to an importance level input index 704. The monitoring apparatus 200 stores the specified importance level in the importance level field 504 of the entry for the sensor ID stored in the sensor ID field 501.

The operation name specification area 705 is an area for specifying the operation name. In FIG. 7, there is illustrated an example in which the operation name can be selected by a radio button. The operator can also input the operation name as text into the operation name specification area 705. The operator specifies the name of the operation performed on the monitoring target 352 observed by the specified sensor. The monitoring apparatus 200 stores the specified operation name in the operation content field 505 of the entry for the sensor ID stored in the sensor ID field 501.

The phenomenon data display area 706 is an area for displaying the phenomenon data of the sensor specified by the sensor specification area 702. The operator specifies the start time and the end time, which indicate the period during which the operation specified by the operation name specification area 705 is performed, from the phenomenon data display area 706. The monitoring apparatus 200 stores the specified start time and end time in the start time field 502 and the end time field 503 of the entry for the sensor ID stored in the sensor ID field 501.

<Processing Procedures>

Figure 8:
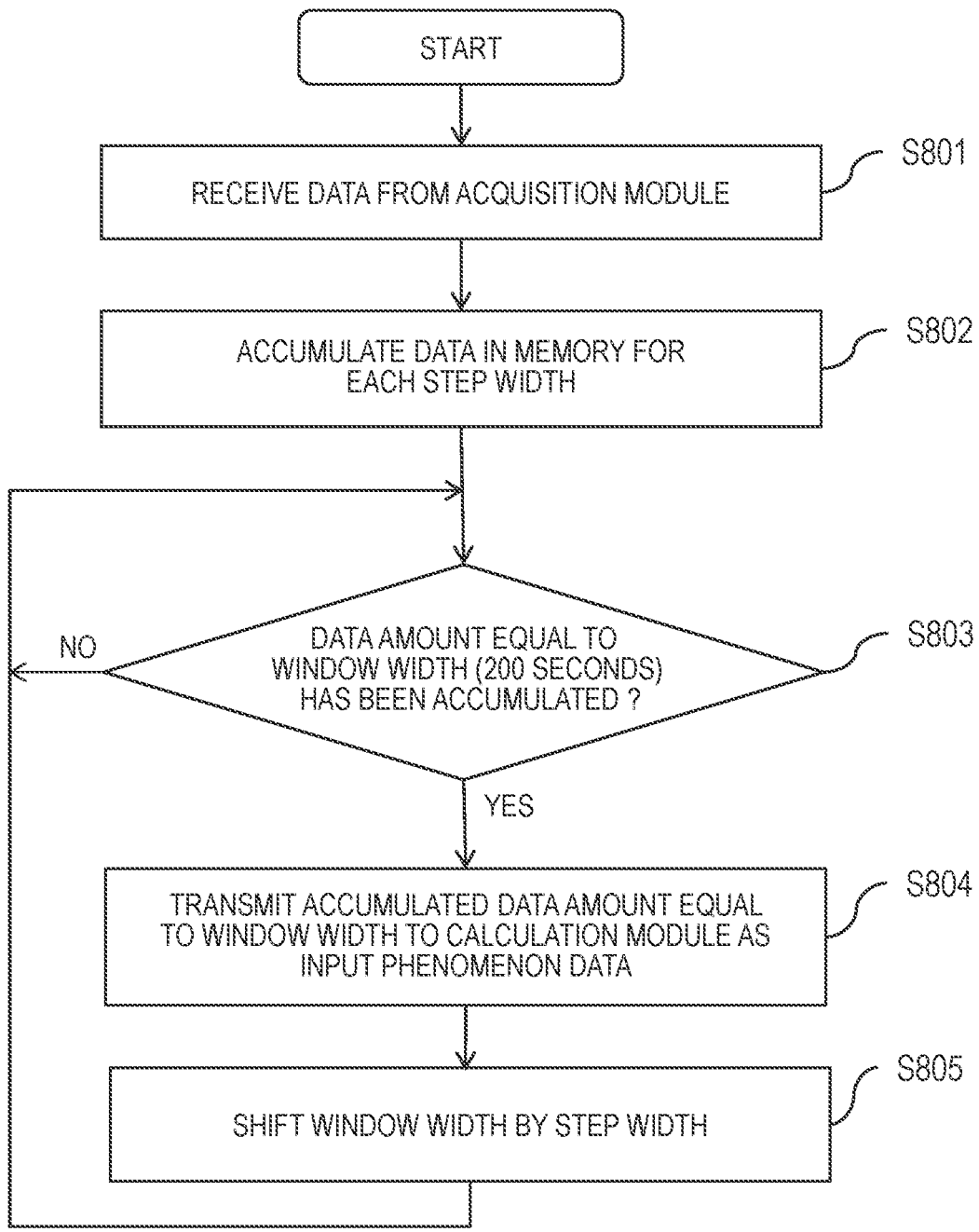
FIG. 8 is a flowchart for illustrating a detailed processing procedure example of the real-time processing by the real-time processing module.

FIG. 8 is a flowchart for illustrating a detailed processing procedure example of the real-time processing by the real-time processing module 303.

The real-time processing module 303 receives data every 1 to 2 seconds, for example, from the acquisition module 302 (Step S801). The real-time processing module 303 accumulates the received data in a memory in time series for each step width (Step S802).

The real-time processing module 303 then waits until a data amount equal to the window width has been accumulated (Step S803: No). When such an amount has been accumulated (Step S803: Yes), the monitoring apparatus 200 outputs the accumulated data amount equal to the window width to the calculation module 304 and the DB 360 as input phenomenon data (Step S804). The real-time processing module 303 shifts an extraction start position by adding an amount equal to the step width (Step S805), and returns the processing to Step S803. As a result, the real-time processing module 303 is capable of outputting input phenomenon data for each window shifted by the step width.

Figure 9:
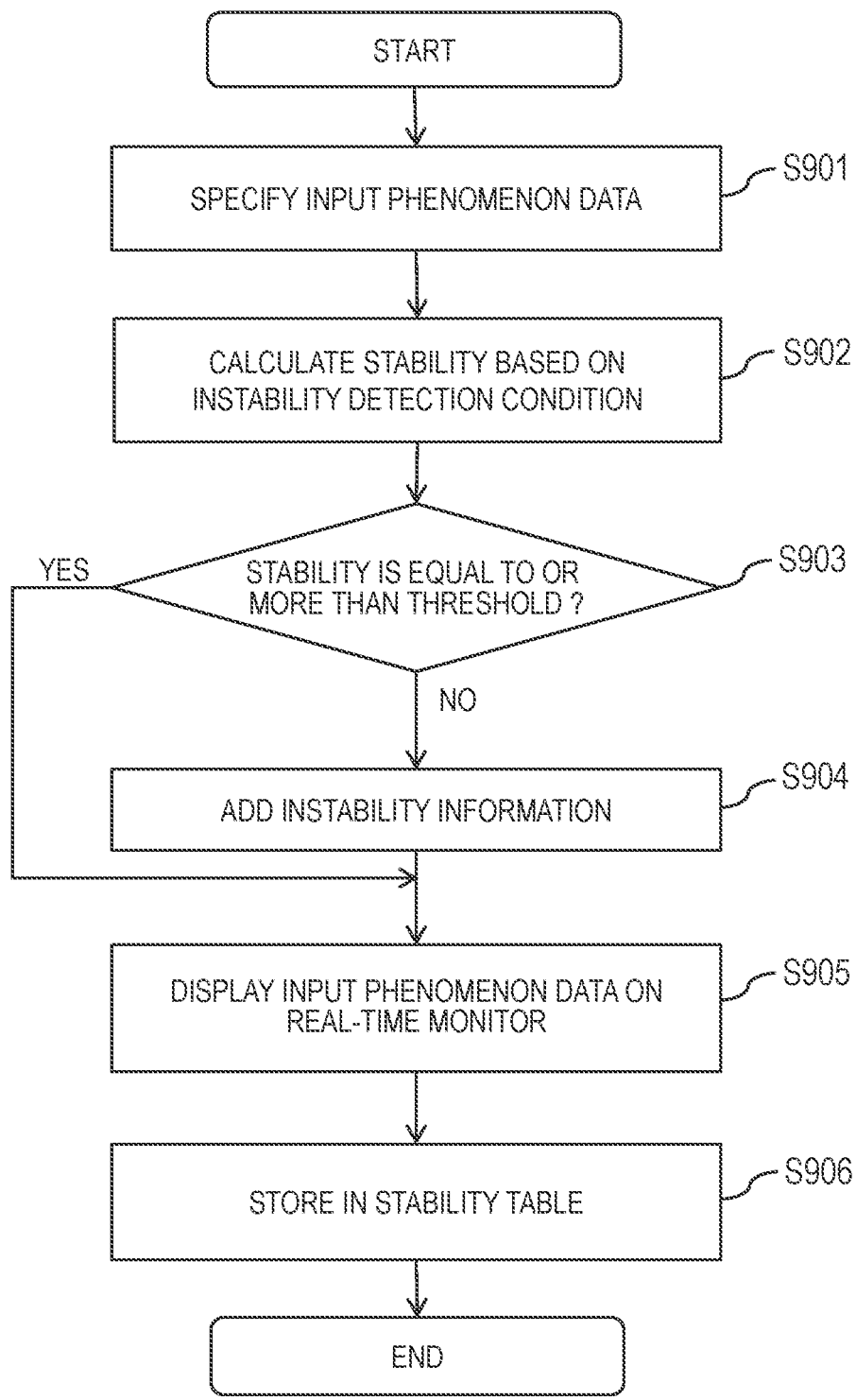
FIG. 9 is a flowchart for illustrating a detailed processing procedure example of the calculation processing by the calculation module.

FIG. 9 is a flowchart for illustrating a detailed processing procedure example of the calculation processing by the calculation module 304. In FIG. 9, there is illustrated an example in which instability information is added. The calculation module 304 receives input phenomenon data from the real-time processing module 303 (Step S901). The calculation module 304 calculates the stability based on the instability detection condition 312 (Step S902). Specifically, for example, the calculation module 304 calculates the stability of the input phenomenon data based on the stability calculation scheme of the instability detection condition 312.

The calculation module 304 then determines whether or not the stability is equal to or more than a threshold (Step S903). The threshold is a stability indicating a specific behavior of the monitoring target 352. For example, when instability information is to be added, the threshold is a stability indicating instability, and when high-stability information is to be added, the threshold is a high stability. This high stability is a higher stability than the stability indicating instability. When the stability is equal to or more than the threshold (Step S903: Yes), the calculation module 304 advances the processing to Step S905. On the other hand, when the stability is less than the threshold (Step S903: No), the calculation module 304 adds instability information to the input phenomenon data (Step S904), which is the calculation source of the stability, and advances the processing to Step S905.

In the case of adding high-stability information, when the stability is equal to or more than the threshold (Step S903: Yes), the calculation module 304 adds instability information to the input phenomenon data (Step S904), which is the calculation source of the stability, and advances the processing to Step S905. When the stability is less than the threshold (Step S903: No), the calculation module 304 advances the processing to Step S905.

In Step S905, the calculation module 304 displays the input phenomenon data (Step S905). The calculation module 304 then stores in the stability table 342 the sensor ID of the sensor that detected the input phenomenon data, the start time and end time of the window of the input phenomenon data, and the calculated stability (Step S906). As a result, the calculation processing is finished. In this manner, based on this calculation processing, the calculation module 304 is capable of storing in the stability table 342 an entry indicating which sensor the input phenomenon data is from, the section that the input phenomenon data is from, and the stability level of the input phenomenon data in that section.

Figure 10:
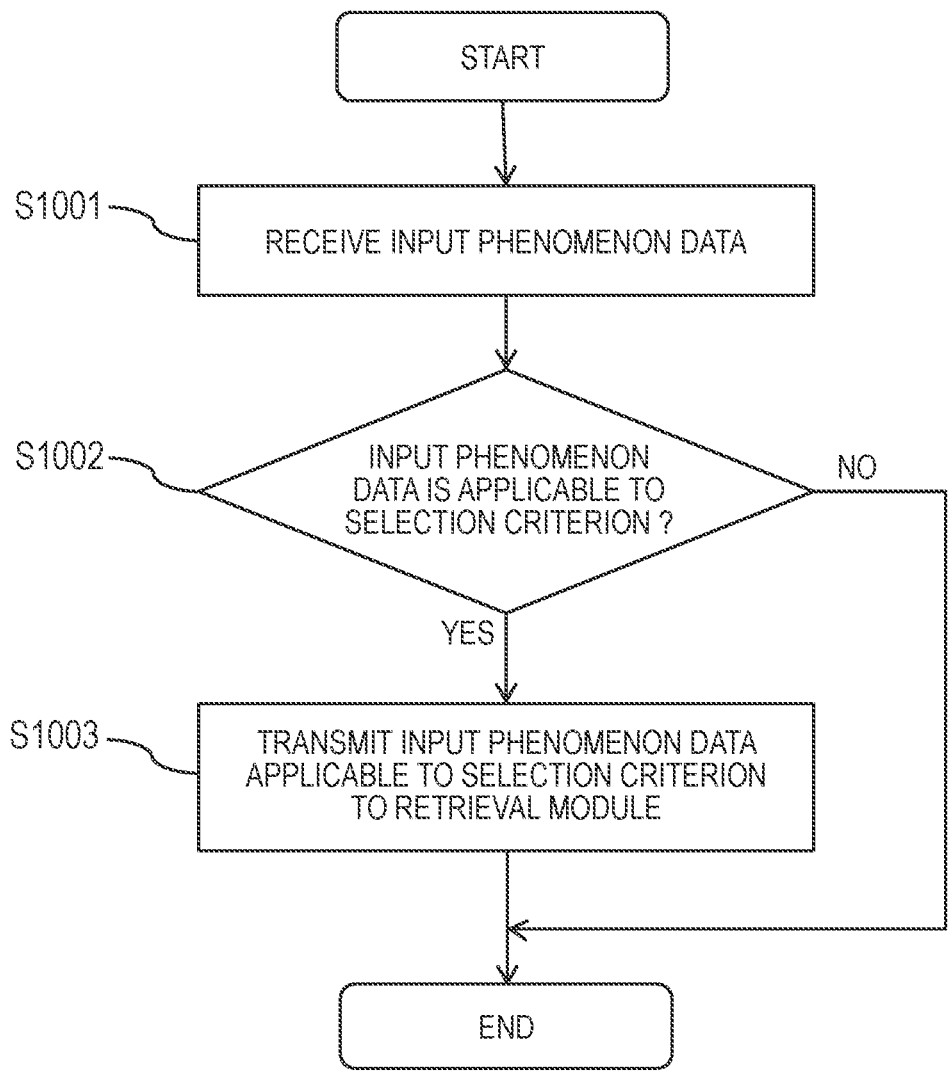
FIG. 10 is a flowchart for illustrating a detailed processing procedure example of the selection processing procedure by the selection module.

FIG. 10 is a flowchart for illustrating a detailed processing procedure example of the selection processing procedure by the selection module 305. The selection module 305 receives input phenomenon data from the calculation module 304 (Step S1001). The selection module 305 determines whether or not the input phenomenon data is applicable to a selection criterion (Step S1002). The selection criterion is for example, an index that the instability information or the high-stability information is added to the input phenomenon data. When the input phenomenon data is applicable to the selection criterion (Step S1002: Yes), the selection module 305 transmits that input phenomenon data to the retrieval module 306 (Step S1003), and ends the selection processing.

On the other hand, when the input phenomenon data is not applicable to the selection criterion (Step S1002: No), the selection module 305 ends the selection processing. As a result, the retrieval module 306 is capable of executing retrieval processing by the retrieval module 306 by using input phenomenon data that is applicable to the selection criterion.

Figure 11:
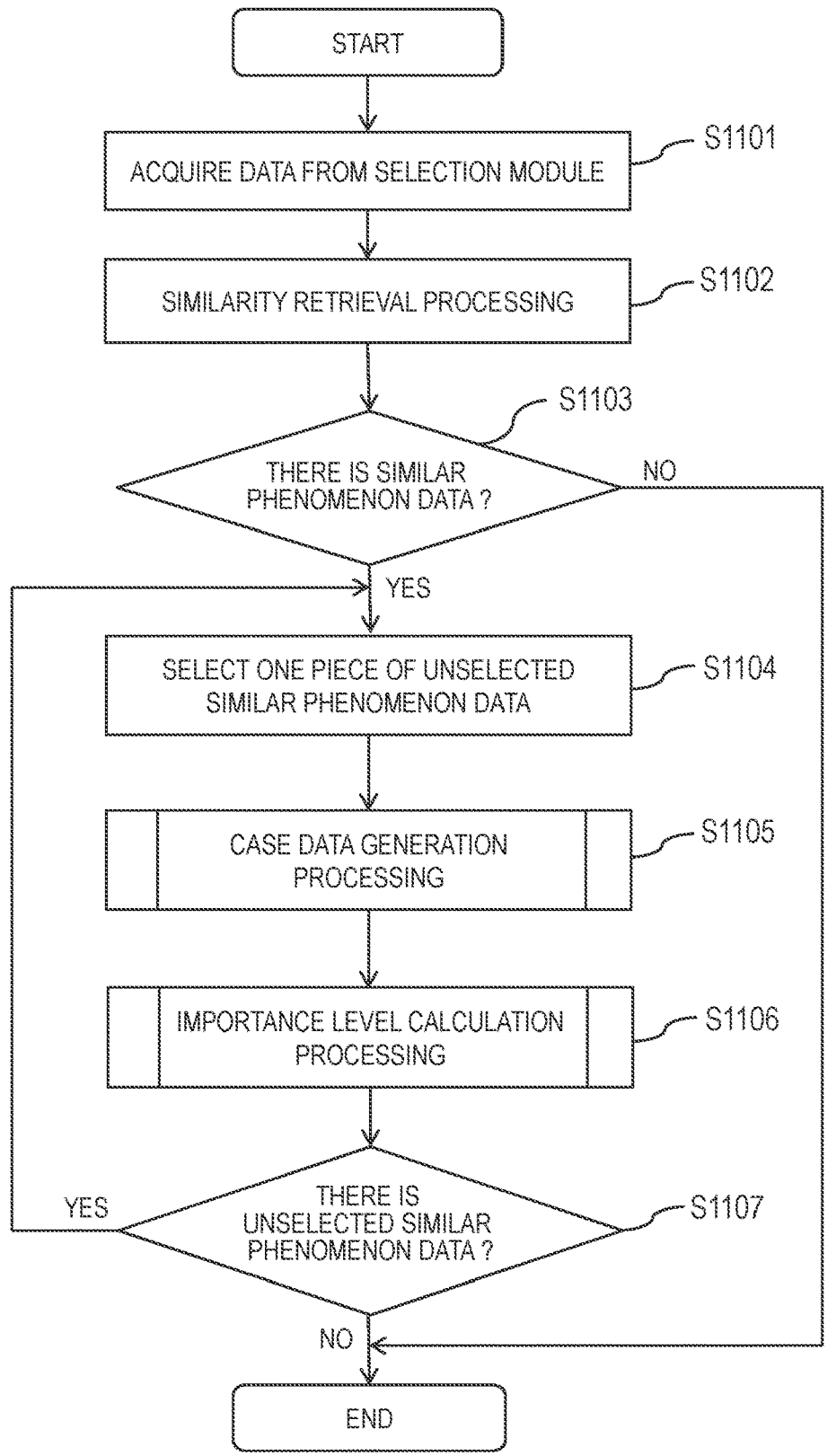
FIG. 11 is a flowchart for illustrating a detailed processing procedure example of the retrieval processing by the retrieval module.

FIG. 11 is a flowchart for illustrating a detailed processing procedure example of the retrieval processing by the retrieval module 306. The retrieval module 306 acquires input phenomenon data from the selection module 305 (Step S1101), and then executes similarity retrieval processing (Step S1102). The retrieval module 306 determines whether or not one or more pieces of similar phenomenon data have been retrieved (Step S1103). When there is no similar phenomenon data (Step S1103: No), the retrieval module 306 ends the retrieval processing. On the other hand, when there is similar phenomenon data (Step S1103: Yes), the retrieval module 306 selects one piece of unselected similar phenomenon data (Step S1104), and executes case data generation processing (Step S1105) and importance level calculation processing (Step S1106) on that selected piece of similar phenomenon data.

The retrieval module 306 then determines whether or not there is unselected similar phenomenon data (Step S1107). When there is unselected similar phenomenon data (Step S1107: Yes), the retrieval module 306 returns the processing to Step S1104. On the other hand, when there is not unselected similar phenomenon data (Step S1107: No), the retrieval module 306 ends the retrieval processing. The case data generation processing (Step S1105) is now described.

Figure 12:
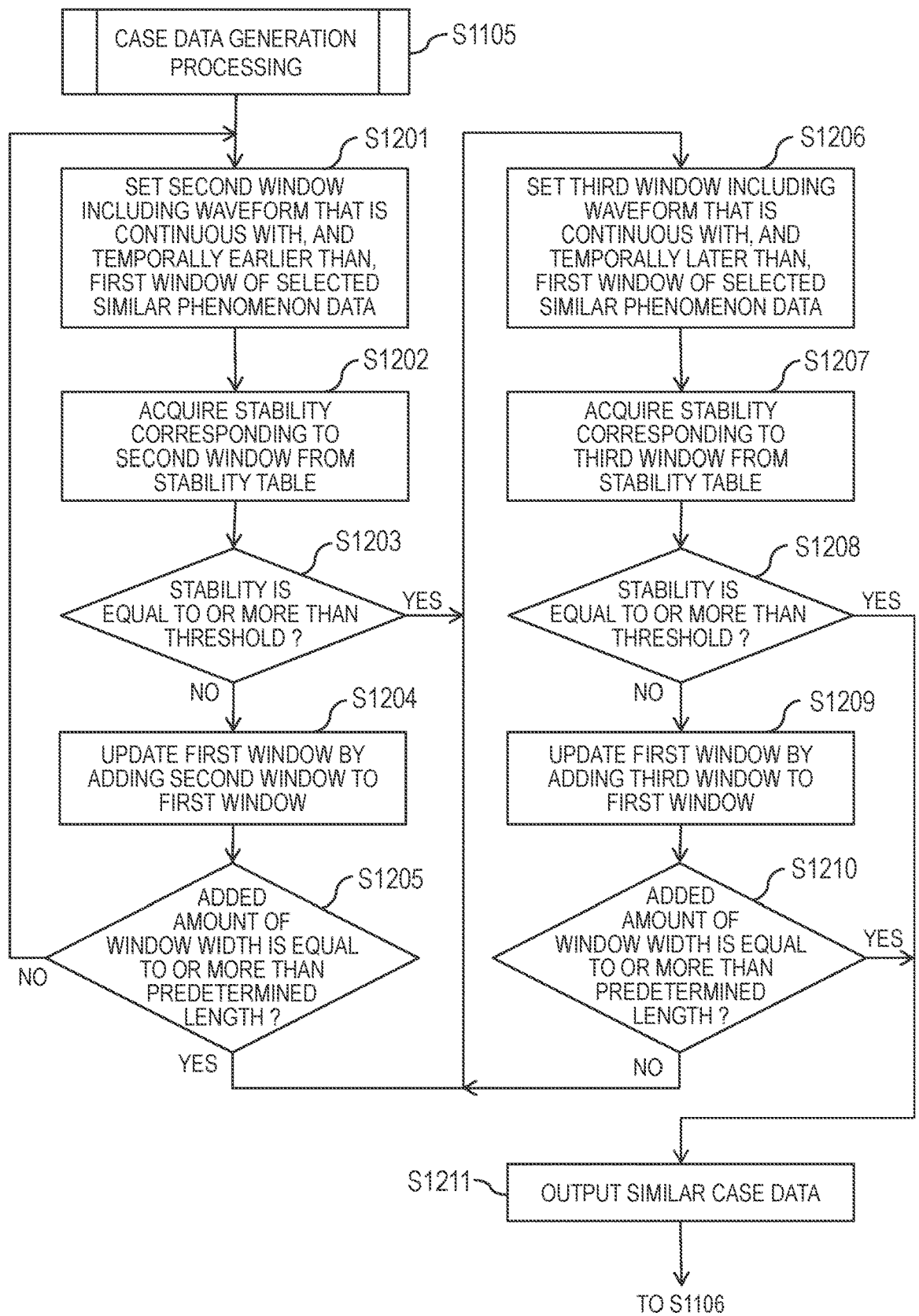
FIG. 12 is a flowchart for illustrating a detailed processing procedure example of the case data generation processing (Step S1105) illustrated in FIG. 11.

FIG. 12 is a flowchart for illustrating a detailed processing procedure example of the case data generation processing (Step S1105) illustrated in FIG. 11. In FIG. 12, a window including the selected similar phenomenon data is referred to as a first window, and the selected similar phenomenon data is similar phenomenon data to which instability information has been added.

The retrieval module 306 sets a window (hereinafter referred to as "second window") including phenomenon data that is continuous with, and temporally earlier than, the selected similar phenomenon data (Step S1201). More specifically, the end time of the second window is in the first window, and the start time of the second window is outside and earlier than the first window.

The retrieval module 306 acquires from the stability table 342 the stability corresponding to the second window (Step S1202). More specifically, the retrieval module 306 acquires from the stability table 342 the stability of the entry matching the start time and the end time of the second window.

The retrieval module 306 determines whether or not the acquired stability is equal to or more than a predetermined threshold (Step S1203). When the acquired stability is equal to or more than the predetermined threshold (Step S1203: Yes), the retrieval module 306 advances the processing to Step S1206. On the other hand, when the acquired stability is not equal to or more than the threshold (Step S203: No), the retrieval module 306 updates the first window by adding the second window to the first window (Step S1204). The retrieval module 306 then determines whether or not the amount of the window width added in Step S1204 is equal to or more than a predetermined length (Step S1205). When the amount is not equal to or more than the predetermined length (Step S1205: No), the retrieval module 306 returns the processing to Step S1201. On the other hand, when the amount is equal to or more than the predetermined length (Step S1205: Yes), the retrieval module 306 advances the processing to Step S1206 in order to halt addition of the second window.

The retrieval module 306 sets a window (hereinafter referred to as "third window") including phenomenon data that is continuous with, and temporally later than, the selected similar phenomenon data (Step S1206). More specifically, the start time of the third window is in the first window, and the end time of the third window is outside and later than the first window.

The retrieval module 306 acquires from the stability table 342 the stability corresponding to the third window (Step S1207). More specifically, the retrieval module 306 acquires from the stability table 342 the stability of the entry matching the start time and the end time of the third window.

The retrieval module 306 determines whether or not the acquired stability is equal to or more than a predetermined threshold (Step S1208). When the acquired stability is equal to or more than the predetermined threshold (Step S1208: Yes), the retrieval module 306 advances the processing to Step S1211. On the other hand, when the acquired stability is not equal to or more than the threshold (Step S1208: No), the retrieval module 306 updates the first window by adding the third window to the first window (Step S1209). The retrieval module 306 then determines whether or not the amount of the window width added in Step S1209 is equal to or more than a predetermined length (Step S1210). When the amount is not equal to or more than the predetermined length (Step S1210: No), the retrieval module 306 returns the processing to Step S1206. On the other hand, when the amount is equal to or more than the predetermined length (Step S1206: Yes), the retrieval module 306 advances the processing to Step S1211 in order to halt addition of the third window.

The retrieval module 306 outputs, to the output module 307, the second window and the case data to which the second window is added (Step S1211), and ends the case data generation processing (Step S1105). As a result, the retrieval module 306 is capable of obtaining case data corresponding to the input phenomenon data. When high-stability information is added to the selected similar phenomenon data, and not instability information, in Step S1203, when the acquired stability is equal to or more than the threshold (Step S1203: Yes), the retrieval module 306 advances the processing to Step S1204, and when the acquired stability is not equal to or more than the threshold (Step S1203: No), the retrieval module 306 advances the processing to Step S1206. Similarly, in Step S1208, when the acquired stability is equal to or more than the threshold (Step S1208: Yes), the retrieval module 306 advances the processing to Step S1209, and when the acquired stability is not equal to or more than the threshold (Step S1208: No), the retrieval module 306 advances the processing to Step S1211.

Figure 13A:
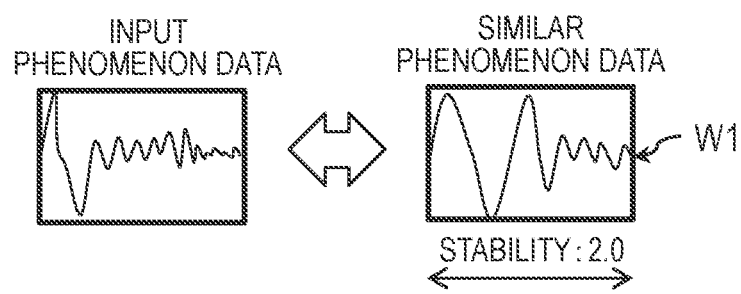
FIG. 13A is an explanatory diagram for illustrating a specific example of the case data generation processing (Step S1105) illustrated in FIG. 11.

FIG. 13A to FIG. 13E are explanatory diagrams for illustrating a specific example of the case data generation processing (Step S1105) illustrated in FIG. 11. In this example, in order to simplify the description, the input phenomenon data is time-series data of one window width. The case data generation processing is described in time series in order from FIG. 13A. The stability threshold is set, as an example, to 8.0. In FIG. 13A, there is illustrated a state in which case data generation processing (Step S1105) has been performed on the selected similar phenomenon data similar to the input phenomenon data. The stability of the selected similar phenomenon data in a first window W1 is 2.0.

Figure 13B:
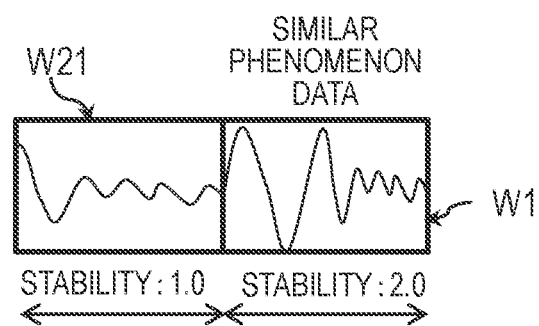
FIG. 13B is an explanatory diagram for illustrating a specific example of the case data generation processing (Step S1105) illustrated in FIG. 11.

In FIG. 13B, there is illustrated a state in which a second window W21 has been set in Step S1201, and the stability (=1.0) of that phenomenon data has been acquired. In this example, it is assumed that the end time of the second window W21 and the start time of the first window W1 match. The stability of the phenomenon data of the second window W21 is 1.0, and thus, in FIG. 13C, a second window is again added.

Figure 13C:
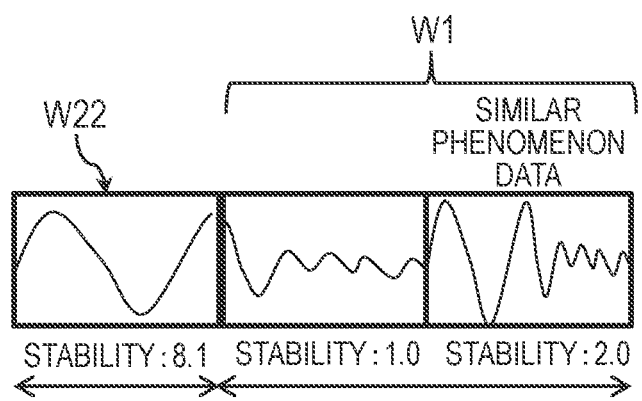
FIG. 13C is an explanatory diagram for illustrating a specific example of the case data generation processing (Step S1105) illustrated in FIG. 11.

In FIG. 13C, there is illustrated the next state after FIG. 13B. The retrieval module 306 updates the first window W1 by adding the second window W21 of FIG. 13B to the first window W1 (Step S1204). As a result, the first window W1 and the second window W21 of FIG. 13B become the first window W1 of FIG. 13C. In FIG. 13C, there is illustrated a state in which the second window W21 has been set in Step S1201, and the stability (=8.1) of that phenomenon data has been acquired. In this example, it is assumed that the end time of a second window W22 and the start time of the first window W1 match. The stability of the phenomenon data of the second window W22 is 8.1, and thus addition of a second window is ended.

Figure 13D:
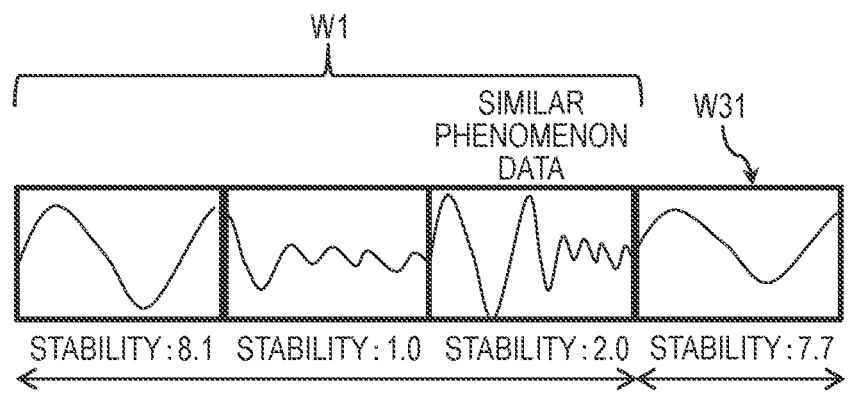
FIG. 13D is an explanatory diagram for illustrating a specific example of the case data generation processing (Step S1105) illustrated in FIG. 11.

In FIG. 13D, there is illustrated the next state after FIG. 13C. The retrieval module 306 updates the first window W1 by adding the second window W22 of FIG. 13C to the first window W1 (Step S1204). As a result, the first window W1 and the second window W22 of FIG. 13C become the first window W1 of FIG. 13D. In FIG. 13D, there is illustrated a state in which a third window W31 has been set in Step S1206, and the stability (=7.7) of that phenomenon data has been acquired. In this example, it is assumed that the start time of the third window W31 and the end time of the first window W1 match. The stability of the phenomenon data of the third window W31 is 7.7, and thus a third window is added again in FIG. 13E.

Figure 13E:
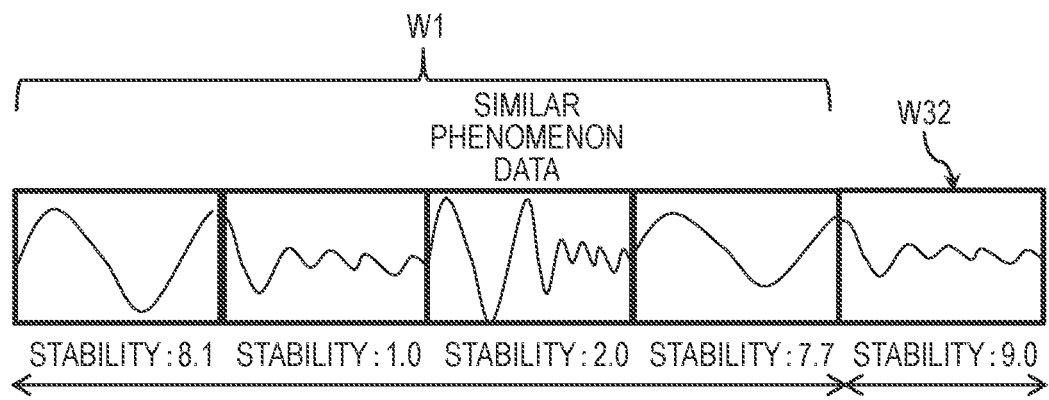
FIG. 13E is an explanatory diagram for illustrating a specific example of the case data generation processing (Step S1105) illustrated in FIG. 11.

In FIG. 13E, there is illustrated the next state after FIG. 13D. The retrieval module 306 updates the first window W1 by adding the third window W31 of FIG. 13D to the first window W1 (Step S1204). As a result, the first window W1 and the third window W31 of FIG. 13D become the first window W1 of FIG. 13E. In FIG. 13E, there is illustrated a state in which a third window W32 has been set in Step S1206, and the stability (=9.0) of that phenomenon data has been acquired. In this example, it is assumed that the end time of the third window W32 and the start time of the first window W1 match. The stability of the phenomenon data of the third window W32 is 9.0, and thus addition of a third window is ended. In this way, the retrieval module 306 is capable of acquiring in FIG. 13E case data including the selected similar phenomenon data based on the case data generation processing (Step S1105).

Figure 14:
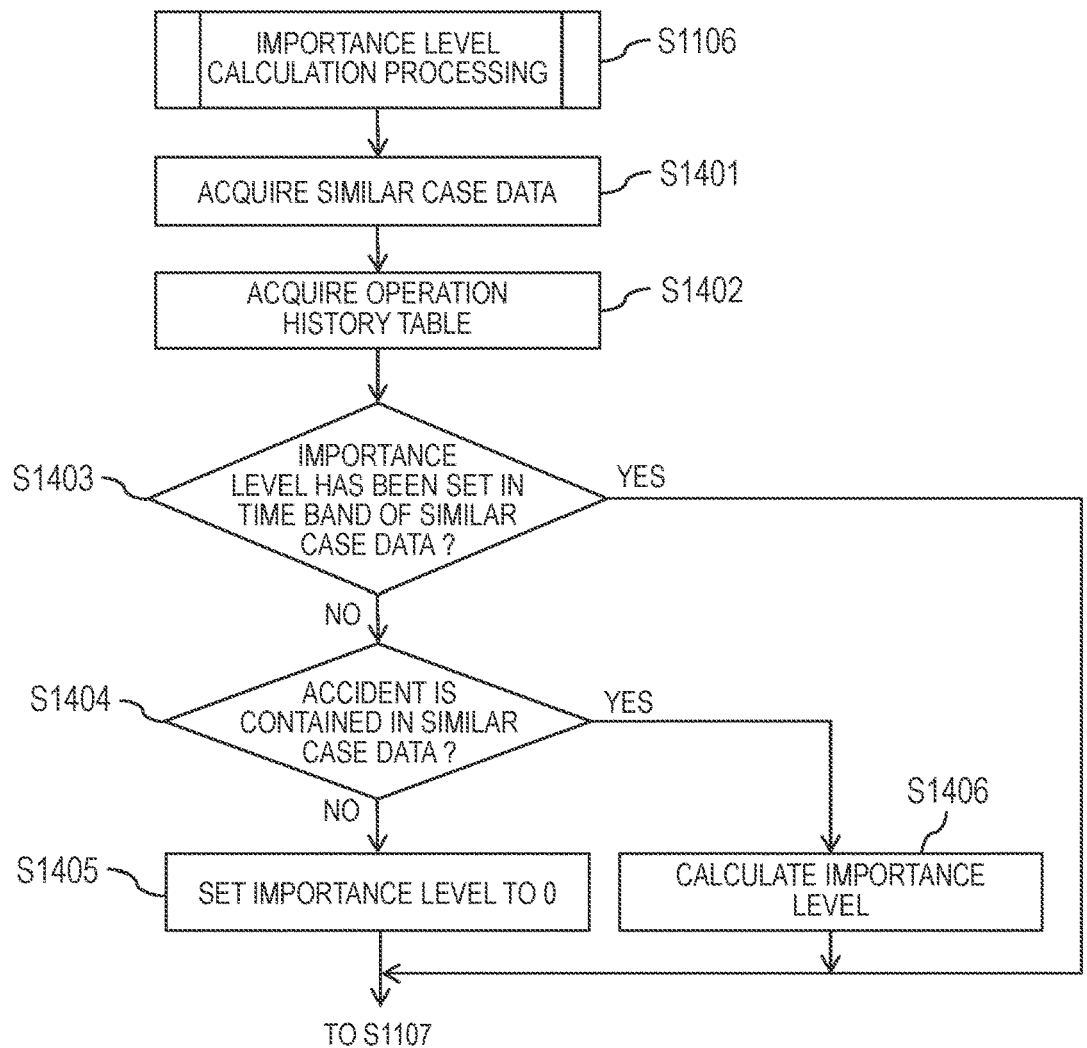
FIG. 14 is a flowchart for illustrating a detailed processing procedure example of the importance level calculation processing (Step S1106) illustrated in FIG. 11.

FIG. 14 is a flowchart for illustrating a detailed processing procedure example of the importance level calculation processing (Step S1106) illustrated in FIG. 11. The importance level calculation processing (Step S1106) is optional processing. The retrieval module 306 acquires the case data obtained in the case data generation processing (Step S1105) (Step S1401). The retrieval module 306 then acquires the operation history table 314 (Step S1402). The retrieval module 306 determines whether or not the importance level has been set in the time band of the case data by referring to the operation history table 314 (Step S1403). When the importance level has been set (Step S1403: Yes), there is no need to calculate the importance level, and thus the retrieval module 306 ends the importance level calculation processing (Step S1106).

On the other hand, when the importance level has not been set (Step S1403: No), the retrieval module 306 determines whether or not an accident is contained in the case data (Step S1404). For example, the retrieval module 306 determines whether or not, for each window forming the case data, the stability is equal to or less than a threshold (e.g., 1) indicating an accident. For the case data of FIG. 13E, there is a window having a stability of 1.0, and thus the retrieval module 306 determines that the case data includes an accident. When an accident is not included (Step S1405: No), the retrieval module 306 sets the importance level of that case data to 0 (Step S1405), and then ends the importance level calculation processing (Step S1106). On the other hand, when an accident is included (Step S1405: Yes), the retrieval module 306 calculates the importance level of that case data (Step S1406), and then ends the importance level calculation processing (Step S1106).

Figure 15:
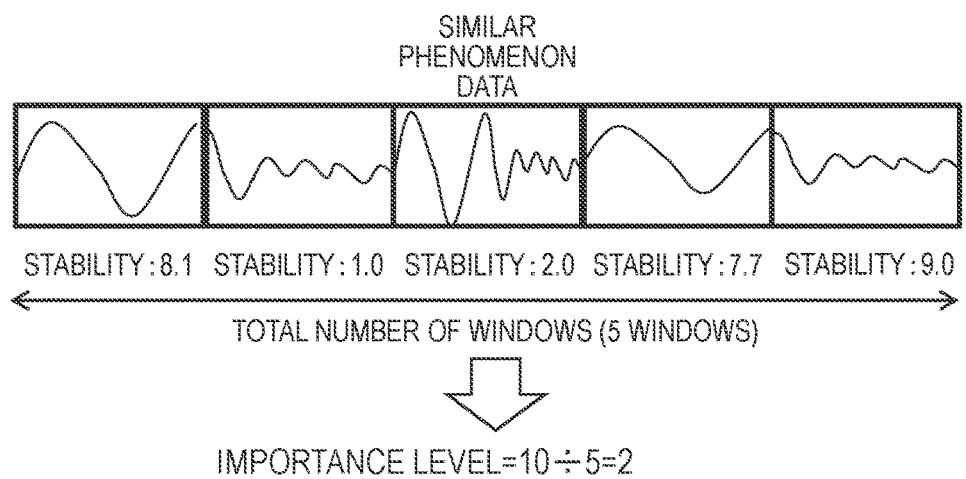
FIG. 15 is an explanatory diagram for illustrating a calculation example of the importance level in Step S1406 of FIG. 14.

FIG. 15 is an explanatory diagram for illustrating a calculation example of the importance level in Step S1406 of FIG. 14. When it is determines that the case data of FIG. 13E includes an accident, the importance level of that case data is set to a value (in this case, 2) obtained by dividing a given value (e.g., maximum importance level of 10) by the number of windows forming the case data (in this case 5).

<Output Example>

Figure 16:
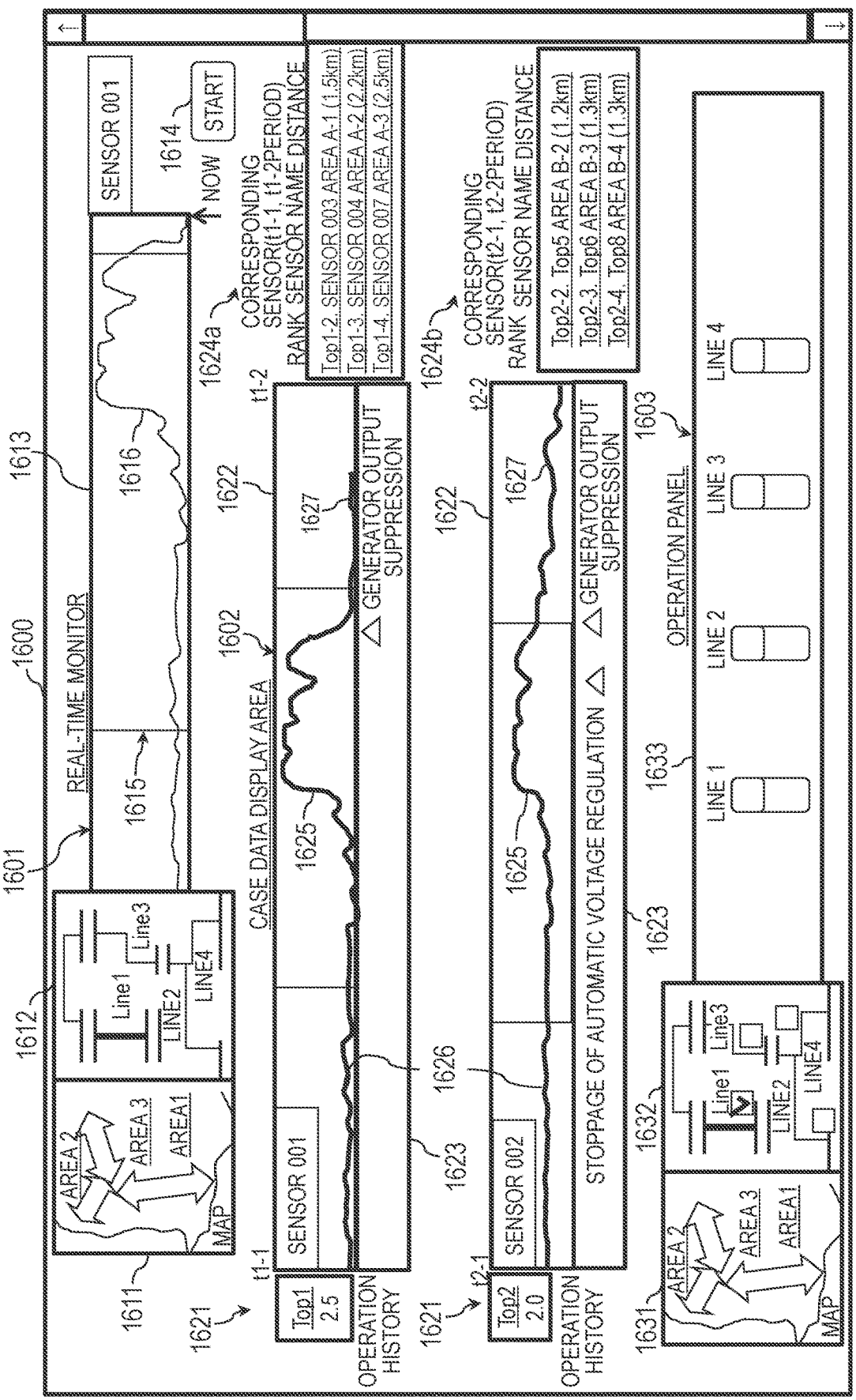
FIG. 16 is an explanatory diagram for illustrating a display screen, which is an output example of a retrieval result obtained by the output module.

FIG. 16 is an explanatory diagram for illustrating a display screen, which is an output example of a retrieval result obtained by the output module 307. A display screen 1600 of FIG. 16 is a screen example illustrating in detail the display data 100 of FIG. 1. The display screen 1600 includes a real-time monitor 1601 for displaying a current state and a past state of the monitoring target 352, a case data display area 1602 for displaying past important similar examples, and an operation panel 1603 on which the operator performs operations on the monitoring target 352.

The real-time monitor 1601 includes a map 1611 for showing a region in which instability has been detected, a line display area 1612 for showing a line in which instability has been detected, a graph 1613 for showing a waveform of that line, and a similar case retrieval start button 1614 to be used by the operator to issue an instruction to start a similar case.

In the graph 1613, information on the sensor on the line in which instability has occurred, for example, time-series data of frequency, current, and voltage, is displayed as a waveform. When the operator has selected, among the waveforms displayed on the graph 1613, a waveform 1616, namely, the input phenomenon data, of a detection target period 1615 for which the operator particularly wishes to investigate a similar case, and pressed the similar case retrieval start button 1614, the monitoring apparatus 200 executes the processing by the calculation module 304, the selection module 305, the retrieval module 306, and the output module 307, and displays the case data relating to the waveform 1616 (hereinafter referred to as "similar case data") on the case data display area 1602. When the importance level calculation processing (Step S1106) has been executed, the monitoring apparatus 200 displays the similar case data in the case data display area 1602 in descending order of importance level.

The case data display area 1602 includes an importance level display section 1621 for showing the importance level of the similar case data, a similar case graph 1622 for showing the similar case data, an operation history display section 1623 for showing an operation history, and a corresponding sensor ranking 1624 for displaying the sensors related to the waveform displayed on the similar case graph 1622 in order of importance level.

In FIG. 16, in the real-time monitor 1601, two pieces of case data similar to the waveform 1616 selected by the operator are shown in order of importance level. One of those pieces of case data is the case data relating to a sensor 001, and the importance level of that piece of case data is "9.5". The other piece of case data is the case data relating to a sensor 002, and the importance level of that piece of case data is "9.4". The monitoring apparatus 200 displays in a highlighted manner on the similar case graph 1622 a waveform 1625 similar to the waveform 1616, namely, the similar phenomenon data, and also displays waveforms 1626 and 1627 of before and after the waveform 1625. The monitoring apparatus 200 also displays, together with the waveforms 1625 to 1627 (i.e., similar case data), a history of the operations performed by the operator in the past on the operation history display section 1623. In the example of FIG. 16, there is illustrated a case in which the operator is performing "generator power suppression" for the sensor 001, and is performing suppression of automatic voltage regulation and generator output suppression for the sensor 002. In the example of FIG. 16, the waveforms are displayed on the similar case graph 1622 in descending order of importance level, but the monitoring apparatus 200 is also capable of displaying the waveforms by sorting the waveforms in order of ascending importance level. For example, case data having an importance level of 1 or less can also be displayed as a case that resulted in an accident. As a result, the operator can confirm the history of operations that resulted in an accident.

A rank, the sensor name, and the importance level (in this example, the distance to the sensor that detected the similar case data is used) of a corresponding sensor are displayed in corresponding sensor rankings 1624a and 1624b. Sensors 003, 004, and 007 corresponding to the sensor 001, which detected similar case data, are displayed in the corresponding sensor ranking 1624a. Sensors 005, 006, and 008 corresponding to the sensor 002, which detected similar case data, are displayed in the corresponding sensor ranking 1624b. In the corresponding sensor rankings, the distances between the sensors, which are obtained by referring to the sensor information table 313, are displayed in order of importance level based on closeness as an index of importance level. The distances between the sensors may be displayed in order of importance level based on farness as an index of importance level, depending on operations by the operator or preliminary settings.

The operation panel 1603 includes a map 1631 for specifying the area in which the operator is to perform an operation, a line specification area 1632 for specifying a line on which the operation is to be performed, and an operation interface 1633. The operator performs the operation 372 on the monitoring target 352 via the operation panel 1603. The control module 308 may control the monitoring target 352, which is the target of the operation 372, through the operation 372. In this case, the control module 308 stores in the operation history table 314 the operation content of the operation 372 and the time at which the operation 372 is performed, together with the sensor ID of the sensor that observed the input phenomenon data, which is the waveform 1616, and the start time and the end time of the detection target period 1615 of the waveform 1616. As a result, the monitoring apparatus 200 is capable of automatically generating the entries of the operation history table 314.

In this way, the monitoring apparatus 200 according to the first embodiment is configured to retrieve similar phenomenon data, which is similar to the input phenomenon data, and phenomenon data, namely, the above-mentioned case data, that is subsequently continuous with the observation of that similar phenomenon data, associate the retrieved case data, the importance level, the operation content, and the operation time, and output the associated data as a retrieval result. Therefore, the monitoring apparatus 200 is capable of easily identifying, based on past similar cases, the details regarding how and why the monitoring target becomes stable or unstable.

As a result, for a monitoring target that is observed as similar phenomenon data having a relatively or absolutely low stability, the operator can easily confirm what operations were performed and how long it took for the monitoring target to recover. Therefore, the operator can decide at an early stage what kind of operations may be performed on the monitoring target for which the input phenomenon data has been observed, which enables a reduction in the time involved in the recovery work without performing trial-and-error.

The operator can also, for a monitoring target that is observed as similar phenomenon data having a relatively or absolutely high stability, easily confirm what operations were performed to cause instability and how long it took for the monitoring target to become unstable. Therefore, the operator can grasp, as a failed example, the kind of operations that were performed on a monitoring target for which the input phenomenon data was observed, and that resulted in the monitoring target becoming unstable, which is helpful in operating the monitoring target.

The operator can also grasp, as a result of similar case data also being included for the phenomenon data before the similar phenomenon data, and not just for the phenomenon data after the similar phenomenon data, how the monitoring target has been operated until reaching the similar phenomenon data.

The monitoring apparatus 200 is capable of presenting to the operator, when the sensor ID, the location group label, and the distance are output together with corresponding similar phenomenon data, a sensor that can possibly observe the same phenomenon data as the similar case data.

Second Embodiment

A second embodiment of this invention is now described. In the first embodiment, the operator performed a setting plan 380, but in the second embodiment, there is described an example in which processing equivalent to the setting plan 380 is executed by the monitoring apparatus 200 by using a setting planning module. As a result, the monitoring apparatus 200 is capable of automatically updating the real-time processing condition 311 and the instability detection condition 312, which enables the burden on the operator to be decreased. In the second embodiment, the description focuses on differences from the first embodiment. Structures that are the same as in the first embodiment are denoted using the same reference numerals, and a description thereof is omitted.

Figure 17:
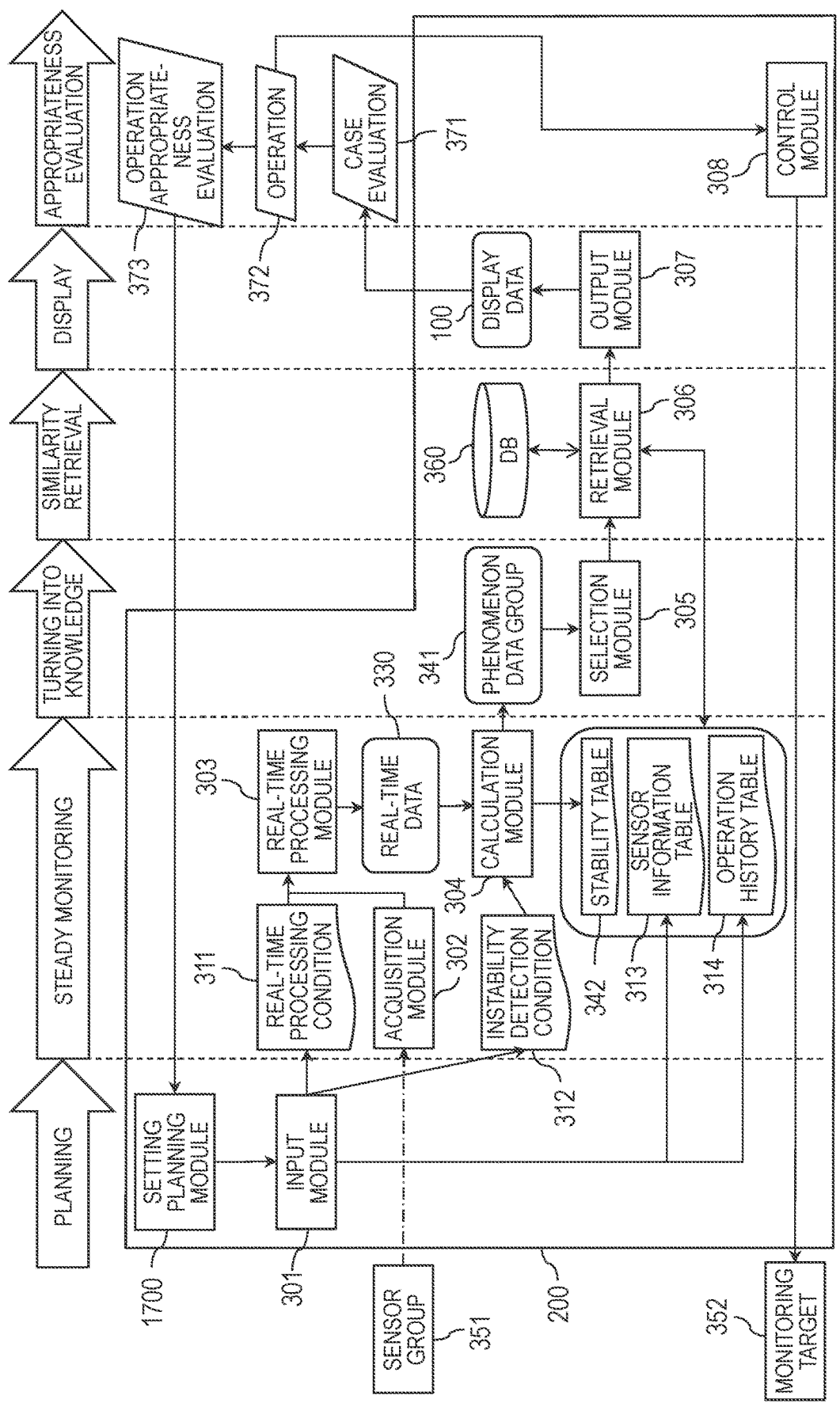
FIG. 17 is a block diagram for illustrating a functional configuration example of the monitoring apparatus according to the second embodiment.

FIG. 17 is a block diagram for illustrating a functional configuration example of the monitoring apparatus 200 according to the second embodiment. The differences from the first embodiment are the addition of a setting planning module 1700, and the point that the setting plan 380 is not necessary. Specifically, for example, the setting planning module 1700 implements the functions of the setting planning module 1700 by causing the processor 201 to execute programs stored in the storage device 202 illustrated in FIG. 2.

The setting planning module 1700 is configured to automatically update the real-time processing condition 311, the instability detection condition 312, and the sensor information table 313 by, after the operator has performed the operation appropriateness evaluation 373, referring to the operation history table 314, the case data, and the sensor information table 313. The setting planning module 1700 is described in detail with reference to FIG. 18.

Figure 18:
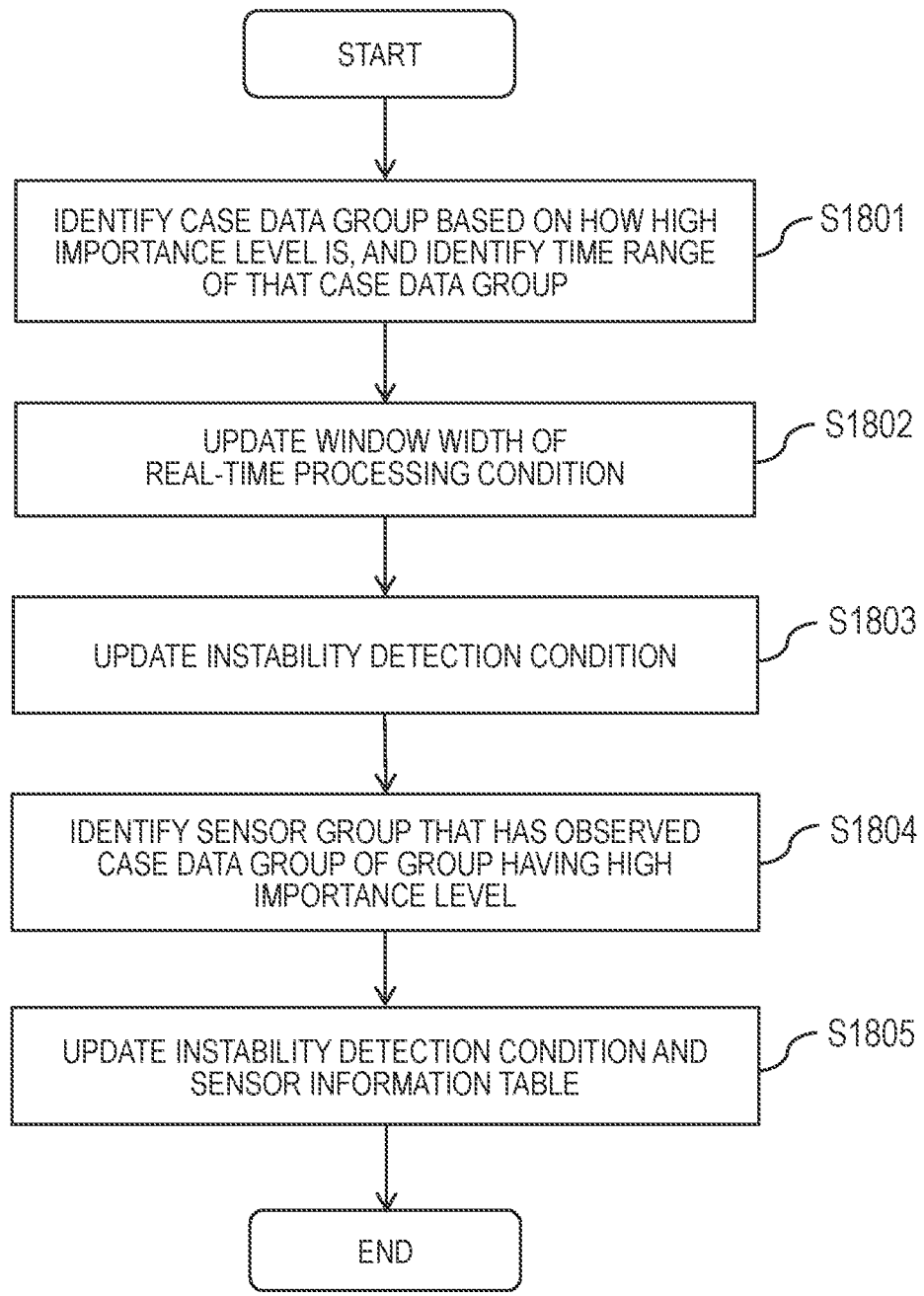
FIG. 18 is a flowchart for illustrating a detailed processing procedure example of the setting planning module.

FIG. 18 is a flowchart for illustrating a detailed processing procedure example of the setting planning module 1700. The setting planning module 1700 identifies a group having a high importance level from case data groups obtained by the retrieval module 306, and identifies a time width of the case data group of the identified group (Step S1801). The group having a high importance level may be a collection of case data having an importance level equal to or more than a predetermined threshold, or may be a collection of case data having an importance level up to an N-th highest level. The time width is a time length of the case data, and is an integral multiple of the window width. For example, for the case data shown in FIG. 13E, when the window width is set to 20 seconds, there are five windows, and hence the time width is 100 seconds. When identifying the time width, the setting planning module 1700 selects a statistical time width, for example, a maximum time width, a minimum time width, an average time width, a median time width, or a randomly selected time width from among the time widths of the case data in the group.

The setting planning module 1700 updates the window width defined in the real-time processing condition (Step S1802). Specifically, for example, the setting planning module 1700 updates the window width defined in the real-time processing condition to the time width identified in Step S1801.

The setting planning module 1700 updates the stability threshold defined in the instability detection condition 312 (Step S1803). Specifically, for example, the setting planning module 1700 updates the stability threshold defined in the instability detection condition 312 based on the stability of the case data used for the identification of the time width in Step S1801. The case data is formed from a plurality of windows. Therefore, the setting planning module 1700 updates the stability threshold defined in the instability detection condition 312 to the lowest stability among the stability of each window of the case data identified in Step S1801. In the case of the average time width being identified in Step S1801, the setting planning module 1700 extracts the lowest stability among the stability of each window in each piece of time-series data used for the calculation of the average time width. The setting planning module 1700 then updates the stability threshold defined in the instability detection condition 312 to the average value of the extracted stabilities.

The setting planning module 1700 identifies the sensor group 351 that observed the case data group of the group having a high importance level identified in Step S1801 (Step S1804).

The setting planning module 1700 updates, by using the sensor group 351 identified in Step S1804, the "instability determination scheme" defined in the instability detection condition 312 (Step S1804). Specifically, for example, the instability determination scheme "consider instability to have occurred when stability is equal to or less than predetermined threshold" is updated to an instability determination scheme "consider instability to have occurred when average value of stability obtained from phenomenon data observed by sensor group (identified in Step S1804) is equal to or less than predetermined threshold". In other words, the setting planning module 1700 changes the "instability determination scheme" from single location Prony analysis to multiple location Prony analysis. The determination scheme is not limited to using an average value, and a maximum value, a minimum value, a median value, or a randomly selected value may be used.

The setting planning module 1700 updates the location group label to the same value such that the sensor group 351 identified in Step S1804 is the same group (Step S1805). After that processing, the setting planning module 1700 ends the setting planning processing.

Figure 19:
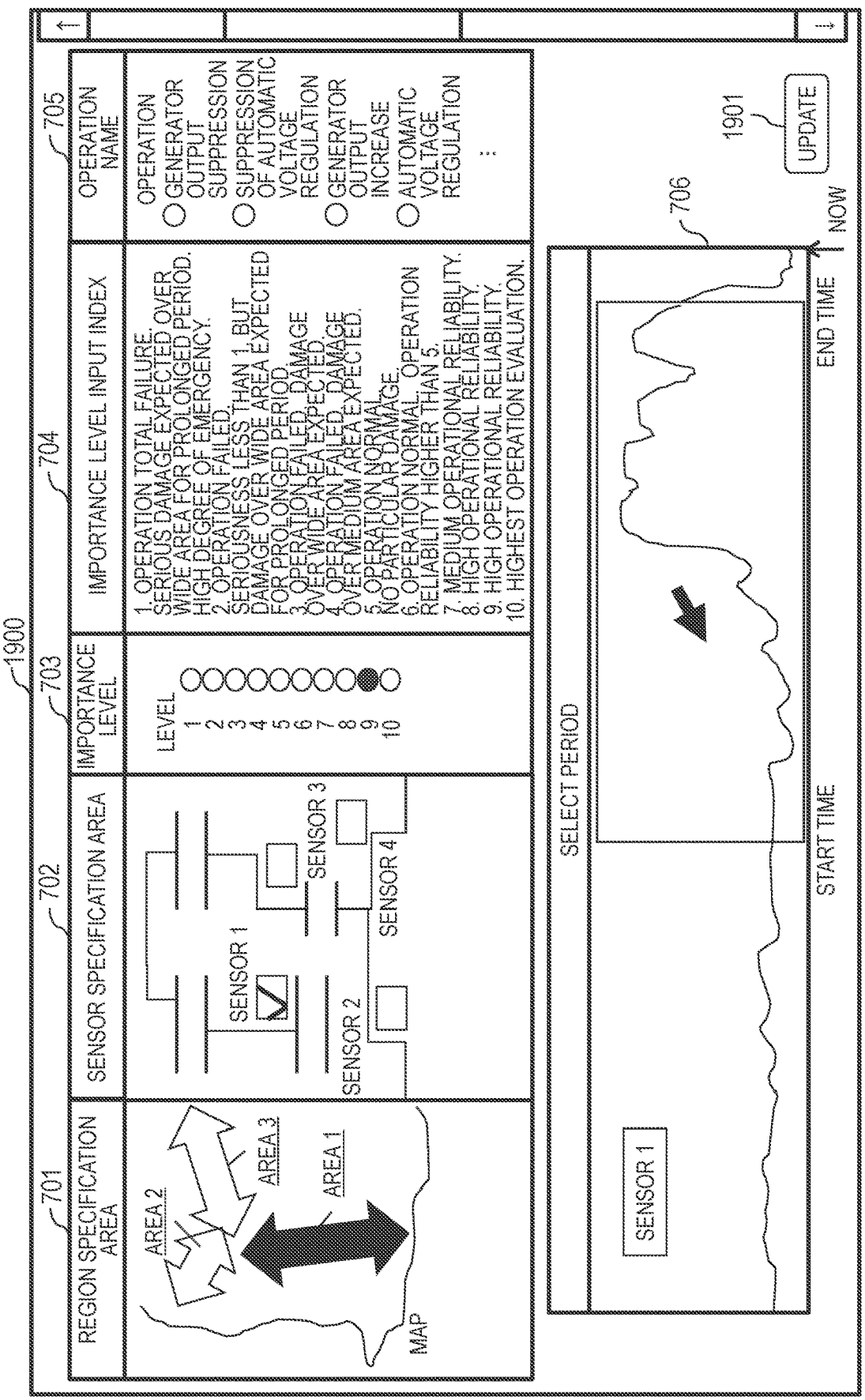
FIG. 19 is an explanatory diagram for illustrating an input screen example of the importance level in the second embodiment.

FIG. 19 is an explanatory diagram for illustrating an input screen example of the importance level in the second embodiment. An input screen 1900 is a screen in which an update button 1901 is added to the input screen 700 of FIG. 7. When the update button 1901 is pressed, the processing illustrated in FIG. 18 is started.

In this way, according to the second embodiment, the monitoring apparatus 200 is capable of automatically updating the real-time processing condition 311 and the instability detection condition 312, which enables the burden on the operator to be decreased. The monitoring apparatus 200 is also capable of setting the sensors of different groups to be the same group by updating the location group label of the sensors. Therefore, after that update, the monitoring apparatus 200 is capable of presenting to the operator, when the sensor ID, the location group label, and the distance are output together with corresponding similar phenomenon data, a sensor that can possibly observe the same phenomenon data as the similar case data.

It should be noted that this invention is not limited to the above-mentioned embodiments, and encompasses various modification examples and the equivalent configurations within the scope of the appended claims without departing from the gist of this invention. For example, the above-mentioned embodiments are described in detail for a better understanding of this invention, and this invention is not necessarily limited to what includes all the configurations that have been described. Further, a part of the configurations according to a given embodiment may be replaced by the configurations according to another embodiment. Further, the configurations according to another embodiment may be added to the configurations according to a given embodiment. Further, a part of the configurations according to each embodiment may be added to, deleted from, or replaced by another configuration.

Further, a part or entirety of the respective configurations, functions, processing modules, processing means, and the like that have been described may be implemented by hardware, for example, may be designed as an integrated circuit, or may be implemented by software by a processor interpreting and executing programs for implementing the respective functions.

The information on the programs, tables, files, and the like for implementing the respective functions can be stored in a storage device such as a memory, a hard disk drive, or a solid state drive (SSD) or a recording medium such as an IC card, an SD card, or a DVD.

Further, control lines and information lines that are assumed to be necessary for the sake of description are described, but not all the control lines and information lines that are necessary in terms of implementation are described. It may be considered that almost all the components are connected to one another in actuality.

What is claimed is:

1. A monitoring apparatus, which is coupled to a sensor configured to observe a behavior of a monitoring target, and is capable of accessing a storage device, wherein the storage device is configured to store:
 a database configured to store a phenomenon data group, which is a collection of phenomenon data representing a time-series observation value observed by the sensor for each piece of the phenomenon data, the phenomenon data having a predetermined time width;
 stability information including, for each piece of phenomenon data in the phenomenon data group, a stability indicating how stably the monitoring target is operating during each piece of phenomenon data, respectively; and
 operation history information for storing identification information of the sensor, a given time range, and content of an operation performed on the monitoring target in the given time range,
 the monitoring apparatus being configured to execute:
  receive processing for receiving input phenomenon data representing a time-series observation value observed by the sensor during a target period;
  calculation processing for calculating a stability of the input phenomenon data during the target period;
  determination processing for determining whether or not the stability of the input phenomenon data calculated by the calculation processing corresponds to a stability indicating a specific behavior by the monitoring target;
  retrieval processing for retrieving from the database, when it is determined by the determination processing that the stability of the input phenomenon data corresponds to a stability indicating the specific behavior, similar phenomenon data that is similar to the input phenomenon data;
  generation processing for:
  sequentially analyzing earlier phenomenon data continuous with the similar phenomenon data occurring before a period of the similar phenomenon data starting from a time period closest to and before the period of the similar phenomenon data and extending in sequentially earlier time periods having the predetermined time widths from the time period of the similar phenomenon data until a stability of one of the earlier phenomenon data for a particular earlier time period no longer indicates the specific behavior by the monitoring target;
  sequentially analyzing subsequent phenomenon data continuous with the similar phenomenon data occurring after the period of the similar phenomenon data starting from a time period closest to and after the period of the similar phenomenon data and extending in sequentially subsequent time periods having the predetermined time widths from the time period of the similar phenomenon data until a stability of one of the subsequent phenomenon data for a particular subsequent time period no longer indicates the specific behavior by the monitoring target; and
  generating similar case data by combining the similar phenomenon data, the earlier phenomenon data, and the subsequent phenomenon data;
  identification processing for identifying, from the operation history information, operation content corresponding to the time period of the similar case data generated by the generation processing; and
  output processing for outputting the similar case data and outputting the operation content identified by the identification processing in association with each other.

2. The monitoring apparatus according to claim 1, wherein the stability indicating the specific behavior comprises a first threshold in which the behavior of the monitoring target indicates instability.

3. The monitoring apparatus according to claim 2, wherein the stability no longer indicating the specific behavior by the monitoring target comprises a second threshold larger than the first threshold.

4. The monitoring apparatus according to claim 1,
 wherein the monitoring apparatus is configured to calculate, in the identification processing, an importance level of the similar case data based on a period length of the similar case data, and
 wherein, in the output processing, the operation content identified by the identification processing is outputted along with the importance level in association with each other.

5. The monitoring apparatus according to claim 1,
 wherein the storage device is configured to store, in the operation history information, an importance level of phenomenon data representing a time-series observation value in the given time range,
 wherein the monitoring apparatus is configured to acquire, in the identification processing, from the operation history information, identification information from a sensor that has observed the similar case data and an importance level of the given time range corresponding to a period length of the similar case data, and
 wherein in the output processing, the operation content identified by the identification processing is outputted along with the importance level in association with each other.

6. The monitoring apparatus according to claim 1,
 wherein the storage device is configured to store, for a plurality of sensors, sensor information comprising identification information and position information, and
 wherein the monitoring apparatus is configured to output, in the output processing, identification information on a sensor within a predetermined distance from a position of the sensor that has observed the similar case data.

7. The monitoring apparatus according to claim 4, wherein the monitoring apparatus is configured to execute, based on the importance level, update processing for updating the predetermined time width in accordance with the period length of the similar phenomenon data.

8. The monitoring apparatus according to claim 1, wherein the monitoring apparatus is configured to execute, based on a stability of each period of a plurality of periods of the similar phenomenon data, update processing for updating the stability indicating the specific behavior.

9. The monitoring apparatus according to claim 1,
 wherein the storage device is configured to store, for each of a plurality of sensors, sensor information comprising identification information, position information, and group information indicating an affiliated group,
 wherein the monitoring apparatus is configured to output, in the output processing, identification information on another sensor within a predetermined distance from a position of the sensor that has observed the similar case data, and wherein the monitoring apparatus is configured to execute update processing for updating, as the same group information, pieces of group information on the sensor that has observed the similar case data and the another sensor.

10. The monitoring apparatus according to claim 9, wherein the monitoring apparatus is configured to update the stability indicating the specific behavior based on a statistical value of stability obtained from the phenomenon data group observed by a sensor group updated as the same group information.

11. A monitoring method to be executed by a monitoring apparatus, which is coupled to a sensor configured to observe a behavior of a monitoring target, and is capable of accessing a storage device, wherein the storage device is configured to store:
  a database configured to store a phenomenon data group, which is a collection of phenomenon data representing a time-series observation value observed by the sensor for each piece of the phenomenon data, the phenomenon data having a predetermined time width;
  stability information including, for each piece of phenomenon data in the phenomenon data group, a stability indicating how stably the monitoring target is operating during each piece of the phenomenon data, respectively; and
  operation history information for storing identification information on the sensor, a given time range, and content of an operation performed on the monitoring target in the given time range,
  the monitoring method comprising executing, by the monitoring apparatus:
    calculation processing for calculating a stability of input phenomenon data representing a time-series observation value observed by the sensor during a target period;
    determination processing for determining whether or not the stability of the input phenomenon data calculated by the calculation processing is a stability indicating a specific behavior by the monitoring target;
    retrieval processing for retrieving from the database, when it is determined by the determination processing that the stability of the input phenomenon data is a stability indicating the specific behavior, similar phenomenon data that is similar to the input phenomenon data;
    generation processing for:
      sequentially analyzing earlier phenomenon data continuous with the similar phenomenon data occurring before a period of the similar phenomenon data starting from a time period closest to and before the period of the similar phenomenon data and extending in sequentially earlier time periods having the predetermined time widths from the time period of the similar phenomenon data until a stability of one of the earlier phenomenon data for a particular earlier time period no longer indicates the specific behavior by the monitoring target;
      sequentially analyzing subsequent phenomenon data continuous with the similar phenomenon data occurring after the period of the similar phenomenon data starting from a time period closest to and after the period of the similar phenomenon data and extending in sequentially subsequent time periods having the predetermined time widths from the time period of the similar phenomenon data until a stability of one of the subsequent phenomenon data for a particular subsequent time period no longer indicates the specific behavior by the monitoring target; and
      generating similar case data by combining the similar phenomenon data, the earlier phenomenon data, and the subsequent phenomenon data;
    identification processing for identifying, from the operation history information, operation content corresponding to the period of the similar case data generated by the generation processing; and
    output processing for outputting the similar case data and outputting the operation content identified by the identification processing in association with each other.

12. A non-transitory recording medium having stored thereon a monitoring program to be executed by a processor included in a monitoring apparatus, which is coupled to a sensor configured to observe a behavior of a monitoring target, and is capable of accessing a storage device, the non-transitory recording medium being readable by the processor, wherein the storage device is configured to store:
  a database configured to store a phenomenon data group, which is a collection of phenomenon data representing a time-series observation value observed by the sensor for each piece of the phenomenon data, the phenomenon data having a predetermined time width;
  stability information including, for each piece of phenomenon data in the phenomenon data group, a stability indicating how stably the monitoring target is operating during each piece of phenomenon data, respectively; and
  operation history information for storing identification information on the sensor, a given time range, and content of an operation performed on the monitoring target in the given time range,
  the monitoring program causing the processor to execute:
    calculation processing for calculating a stability of input phenomenon data representing a time-series observation value observed by the sensor during a target period;
    determination processing for determining whether or not the stability of the input phenomenon data calculated by the calculation processing is a stability indicating a specific behavior by the monitoring target;
    retrieval processing for retrieving from the database, when it is determined by the determination processing that the stability of the input phenomenon data is a stability indicating the specific behavior, similar phenomenon data that is similar to the input phenomenon data;
    generation processing for:
      sequentially analyzing earlier phenomenon data continuous with the similar phenomenon data occurring before a period of the similar phenomenon data starting from a time period closest to and before the period of the similar phenomenon data and extending in sequentially earlier time periods having the predetermined time widths from the time period of the similar phenomenon data until a stability of one of the earlier phenomenon data for a particular earlier time period no longer indicates the specific behavior by the monitoring target;

sequentially analyzing subsequent phenomenon data continuous with the similar phenomenon data occurring after the period of the similar phenomenon data starting from a time period closest to and after the period of the similar phenomenon data and extending in sequentially subsequent time periods having the predetermined time widths from the time period of the similar phenomenon data until a stability of one of the subsequent phenomenon data for a particular subsequent time period no longer indicates the specific behavior by the monitoring target; and generating similar case data by combining the similar phenomenon data, the earlier phenomenon data, and the subsequent phenomenon data;

identification processing for identifying, from the operation history information, operation content corresponding to the period of the similar case data generated by the generation processing; and output processing for outputting the similar case data and the operation content identified by the identification processing in association with each other, wherein the monitoring apparatus is further configured to generate, in the generation processing, by acquiring a stability of earlier phenomenon data continuous with the similar phenomenon data before a period of the similar phenomenon data until the stability becomes a stability no longer indicating the specific behavior by the monitoring target, similar case data combining the similar phenomenon data, the earlier phenomenon data, and the subsequent phenomenon data.

* * * * *